(12) United States Patent
Tamano et al.

(10) Patent No.: US 8,872,603 B2
(45) Date of Patent: Oct. 28, 2014

(54) RESONATOR AND RESONATOR ARRAY

(75) Inventors: Akimasa Tamano, Osaka (JP); Mitsuhiro Okada, Yawata (JP); Kenichiro Suzuki, Otsu (JP)

(73) Assignee: The Ritsumeikan Trust, Kyoto-shi (JP)

(*) Notice: Subject to any disclaimer, the term of this patent is extended or adjusted under 35 U.S.C. 154(b) by 261 days.

(21) Appl. No.: 12/921,008

(22) PCT Filed: Mar. 3, 2009

(86) PCT No.: PCT/JP2009/053916
§ 371 (c)(1),
(2), (4) Date: Sep. 3, 2010

(87) PCT Pub. No.: WO2009/110442
PCT Pub. Date: Sep. 11, 2009

(65) Prior Publication Data
US 2011/0012694 A1    Jan. 20, 2011

(30) Foreign Application Priority Data

Mar. 4, 2008  (JP) ................................. 2008-053898
Mar. 18, 2008 (JP) ................................. 2008-068690

(51) Int. Cl.
*H03H 9/24* (2006.01)
*H03H 9/02* (2006.01)

(52) U.S. Cl.
CPC ......... *H03H 9/2447* (2013.01); *H03H 9/02244* (2013.01); *H03H 2009/02519* (2013.01)
USPC ....................................................... 333/186

(58) Field of Classification Search
CPC .............. H03H 3/0072; H03H 9/2447; H03H 9/02244; H03H 2009/02519
USPC .......................................................... 333/186
See application file for complete search history.

(56) References Cited

U.S. PATENT DOCUMENTS 6,249,073 B1 * 6/2001 Nguyen et al. ................ 310/309
6,710,680 B2 * 3/2004 Niu et al. ...................... 333/186

(Continued)

FOREIGN PATENT DOCUMENTS

JP    2002-535865 A    10/2002
JP    2006-041911 A    2/2006

(Continued)

OTHER PUBLICATIONS

Hashimura, Akinori et al. "Development of Torsional-Mode RF-MEMS Filter," IEICE Technical Report, The Institute of Electronics, Information, and Communication Engineers, MW 2005-185 (Mar. 2006).
International Search Report of PCT/JP2009/053916, mailing date May 12, 2009.

*Primary Examiner* — Benny Lee
*Assistant Examiner* — Rakesh Patel
(74) *Attorney, Agent, or Firm* — Westerman, Hattori, Daniels & Adrian, LLP

(57) ABSTRACT

[Subject] An object of the present invention is to provide a resonator readily achieving a high resonance frequency without extreme downsizing and allowing for a high Q factor.
[Solving means] A resonator includes: a substrate serving as a base; a first beam having opposite ends fixed to the substrate via fixed connection portions, and having a vibration receiving location for providing linear reciprocating motion in a direction perpendicular to the longitudinal direction thereof; and second beams, branching toward one side from a plurality of branching locations different from the vibration receiving location in the first beam, for generating torsional vibration in accordance with the linear reciprocating motion. The resonator further includes a plurality of third beam, extending from the plurality of branching locations to a side opposite to the plurality of second beams, for generating torsional vibration.

23 Claims, 43 Drawing Sheets

(56) References Cited

U.S. PATENT DOCUMENTS

| | | | |
|---|---|---|---|
| 7,511,870 B2 * | 3/2009 | Ho et al. | 359/237 |
| 7,595,708 B2 * | 9/2009 | Lutz et al. | 333/186 |
| 7,696,843 B2 | 4/2010 | Hashimura | |
| 7,741,932 B2 * | 6/2010 | Nakamura et al. | 333/186 |
| 2001/0022546 A1 * | 9/2001 | Frey et al. | 333/197 |
| 2001/0030489 A1 | 10/2001 | Nguyen | |
| 2005/0140467 A1 * | 6/2005 | Duwel et al. | 333/189 |
| 2007/0176701 A1 | 8/2007 | Nakamura et al. | |
| 2008/0284544 A1 | 11/2008 | Hashimura | |

FOREIGN PATENT DOCUMENTS

| | | | |
|---|---|---|---|
| JP | 2006-042005 A | 2/2006 | |
| JP | 2007-235937 A | 9/2007 | |
| WO | 00/42705 A1 | 7/2000 | |
| WO | 2006/013741 A1 | 2/2006 | |
| WO | WO 2006083482 A2 * | 8/2006 | H01L 27/12 |
| WO | 2007/037150 A1 | 4/2007 | |

* cited by examiner

RESONATOR AND RESONATOR ARRAY

TECHNICAL FIELD

The present invention relates to a resonator and a resonator array.

BACKGROUND ART

In recent years, an MEMS (Micro Electro Mechanical Systems) technique has been developed which employs a micromachining technique in the field of semiconductor to form a micromachine structure in one piece with an electronic circuit. The MEMS technique is expected to be applied to filters and resonators.

Particularly, a micro mechanical resonator fabricated using such an MEMS technique is suitably used for RF wireless such as a remote key less entry system and spread spectrum communications. One exemplary MEMS filter employing a micro mechanical resonator fabricated by such a MEMS technique is disclosed in Japanese Patent Laying-Open No. 2006-41911 (Patent Document 1). The MEMS filter device described in this document includes a resonator. The resonator includes a vibrator having a square plate-like shape and disposed in parallel with a surface of a substrate and distant away from the substrate. The vibrator is supported by a cylindrical column coupled to the surface of the substrate. A fixed electrode is formed to face each side of the resonator with a predetermined interval interposed therebetween. When the fixed electrode is fed with an alternating-current voltage, electrostatic force is generated between the vibrator and the fixed electrode to vibrate the resonator. In this case, the centers and corners of the respective sides of the vibrator are transversely vibrated. In the case where the resonator is coupled to another resonator via a coupling body, the coupling body conducts longitudinal vibration.

Further, an RF-MEMS filter fabricated using a silicon process highly compatible with a semiconductor process is proposed by Hashimura Akinori et. al, "Development of Torsional-Mode RF-MEMS Filter", IEICE Technical Report, The Institute of Electronics, Information and Communication Engineers, MW2005-185 (2006-3) (Non-Patent Document 1). This document presents that a resonator employing a torsional vibration mode is effective in achieving both a reduced size and a high Q factor.

Patent Document 1: Japanese Patent Laying-Open No. 2006-41911

Non-Patent Document 1: Hashimura Akinori et. al, "Development of Torsional-Mode RF-MEMS Filter", IEICE Technical Report, The Institute of Electronics, Information and Communication Engineers, MW2005-185 (2006-3)

DISCLOSURE OF THE INVENTION

Problems to be Solved by the Invention

Generally, in order to obtain a high resonance frequency in a resonator employing a bending mode or a stretch mode, a vibrator needs to have a small full length or a small diameter. In the MEMS filter disclosed in Patent Document 1, a resonator with a shorter side needs to be fabricated as a targeted resonance frequency is higher. As such, a very fine structure needs to be fabricated in order to obtain a very high resonance frequency, which results in difficulty in fabrication due to limitation of a microfabrication technology, disadvantageously. In addition, the resonator described in Patent Document 1 cannot achieve a sufficiently high Q factor.

Meanwhile, in Non-Patent Document 1, torsional vibration is generated by expansion resulting from heating with laser. This requires a laser element, resulting in a large-scale device. Further, since the vibration is generated through the expansion resulting from heating, an operation thereof is unstable.

In view of this, an object of the present invention is to provide a resonator, which readily achieves a high resonance frequency without extreme downsizing and allows for a high Q factor.

Means for Solving the Problems

To achieve the object, a resonator according to the present invention includes a base; a first beam having one end fixed to the base and having a vibration receiving location for providing linear reciprocating motion in a direction perpendicular to a longitudinal direction thereof; and second beam(s), branching toward one side from a first branching location different from the vibration receiving location in the first beam or branching toward one side from a plurality of branching locations different from the vibration receiving location in the first beam, for generating torsional vibration in accordance with the linear reciprocating motion.

Effects of the Invention

According to the present invention, at the vibration receiving location, the first beam is provided with linear reciprocating motion in the direction perpendicular to the longitudinal direction of the first beam to generate torsional vibration in the second beam(s). The torsional vibration thus generated is utilized as vibration of the resonator, thereby readily achieving a high resonance frequency without extreme downsizing of the resonator. Further, a resonator of such a type employing torsional vibration allows for a high Q factor.

BEST MODES FOR CARRYING OUT THE INVENTION

First Embodiment

Configuration

Figure 1:
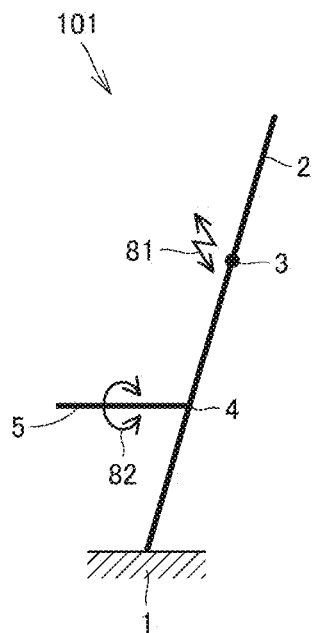
FIG. 1 is a conceptual view of a first example of resonators of a first embodiment according to the present invention.
Figure 2:
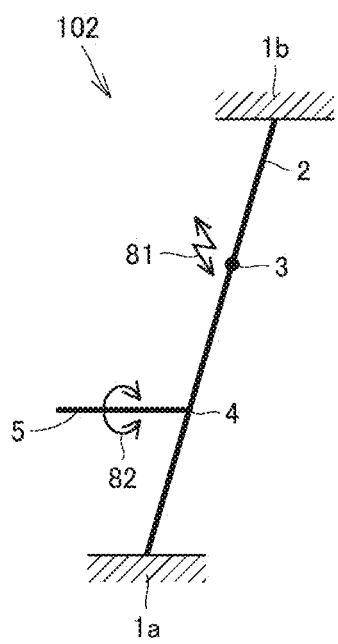
FIG. 2 is a conceptual view of a second example of the resonators of the first embodiment according to the present invention.

Referring to FIGS. 1 and 2, resonators of a first embodiment according to the present invention will be described. As shown in FIG. 1, a resonator 101, which is a first example of the resonators of the present embodiment, includes a base 1; a first beam 2 having one end fixed to base 1, and having a vibration receiving location 3 for providing linear reciprocating motion in a direction perpendicular to the longitudinal direction thereof; and a second beam 5, branching toward one side from a first branching location 4 disposed in first beam 2 but different from vibration receiving location 3, for generating torsional vibration in accordance with the linear reciprocating motion.

As shown in FIG. 2, a resonator 102, which is a second example of the resonators of the present embodiment, has a first beam 2 having one end fixed to a base 1a, and has the other end fixed to a base 1b. Configurations of the other portions thereof are the same as those of resonator 101 serving as the first example.

It should be noted that each of FIGS. 1 and 2 merely illustrates a simplified model, i.e., bases 1, 1a, 1b are illustrated in a simplified manner as if they are walls but they are not limited to such forms. Bases 1a, 1b may have any form as long as each of them serves as a fixed end for the beams vibrating as the resonator. Base 1a and base 1b may be continuous portions in a member or may be separate members. Further, FIGS. 1 and 2 illustrate that first branching location 4 and vibration receiving location 3 are disposed with an equal interval therebetween to equally divide the length of first beam 2 into three, but the ratio of the lengths is not limited to this. The respective positions of first branching location 4 and vibration receiving location 3 can be set appropriately. The same is applied to each of the figures showing models.

(Function and Effect)

In each of resonators 101, 102 of the present embodiment, at vibration receiving location 3, first beam 2 is provided with linear reciprocating motion in the direction perpendicular to the longitudinal direction of first beam 2 as indicated by an arrow 81, thereby transversely vibrating first beam 2. The expression "transversely vibrate (transverse vibration)" herein indicates that the beam is repeatedly displaced in the direction perpendicular to the longitudinal direction of the beam so as to vibrate. In other words, the beam is repeatedly bent and deformed to vibrate. In the description below, the expression "transversely vibrate (transverse vibration)" has the same meaning as recited herein.

When first beam 2 is provided with linear reciprocating motion from vibration receiving location 3 to transversely vibrate, second beam 5, which has its one end bound to first beam 2 via first branching location 4, is displaced following the transverse vibration of first beam 2, thereby generating torsional vibration in second beam 5 as indicated by an arrow 82.

The torsional vibration generated in this way is utilized as vibration of the resonator, thereby readily achieving a high resonance frequency without extreme downsizing of the resonator. Further, such a resonator employing torsional vibration can achieve a high Q factor.

Utilization of the resonator for a filter circuit or an oscillator will be described below.

Second Embodiment

Configuration

Figure 3:
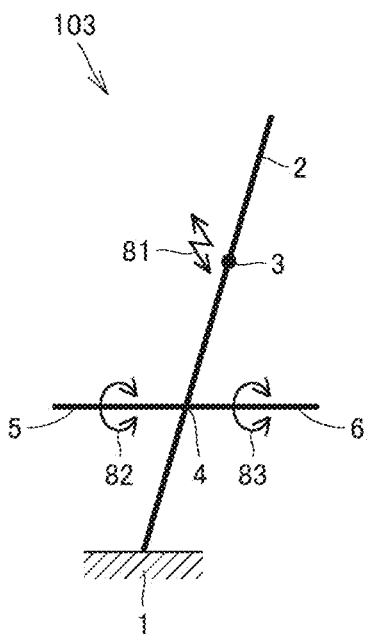
FIG. 3 is a conceptual view of a first example of resonators of a second embodiment according to the present invention.
Figure 4:
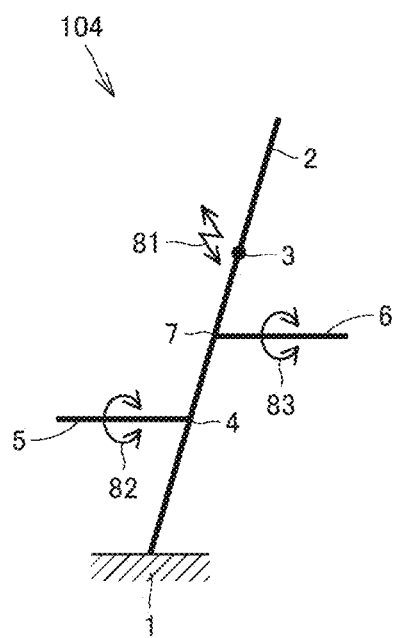
FIG. 4 is a conceptual view of a second example of the resonators of the second embodiment according to the present invention.

Referring to FIGS. 3 and 4, resonators of a second embodiment according to the present invention will be described. As shown in FIG. 3, a resonator 103, which is a first example of the resonators of the present embodiment, includes a third beam 6, extending from a first branching location 4 toward a side opposite to a second beam 5, for generating torsional vibration.

As shown in FIG. 4, a resonator 104, which is a second example of the resonators of the present embodiment, includes a third beam 6, extending from a second branching location 7 different from a vibration receiving location 3 and a first branching location 4 in a first beam 2 toward a side opposite to a second beam 5, for generating torsional vibration.

It should be noted that in each of the figures, the respective lengths of second beam 5 and third beam 6 seem the same but are not limited to the same length.

(Function and Effect)

In each of resonators 103, 104 of the present embodiment, at vibration receiving location 3, first beam 2 is provided with linear reciprocating motion in a direction perpendicular to the longitudinal direction of first beam 2 as indicated by an arrow 81, thereby transversely vibrating first beam 2. On this occasion, second beam 5 and third beam 6, each of which has its one end bound to first beam 2 via first branching location 4 or second branching location 7, are displaced following the transverse vibration of first beam 2, thereby generating torsional vibrations in second beam 5 and third beam 6 as indicated by arrows 82, 83 respectively.

The torsional vibrations are utilized in the same way as described in the first embodiment.

Third Embodiment

Configuration

Figure 5:
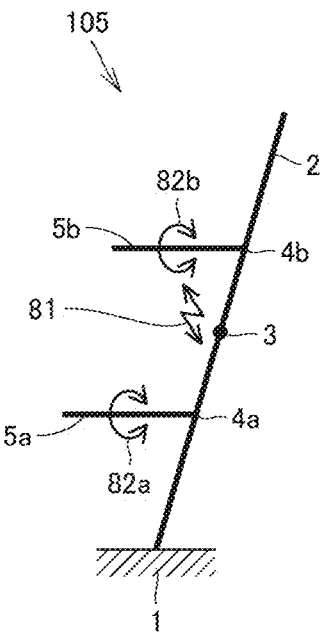
FIG. 5 is a conceptual view of a first example of resonators of a third embodiment according to the present invention.
Figure 6:
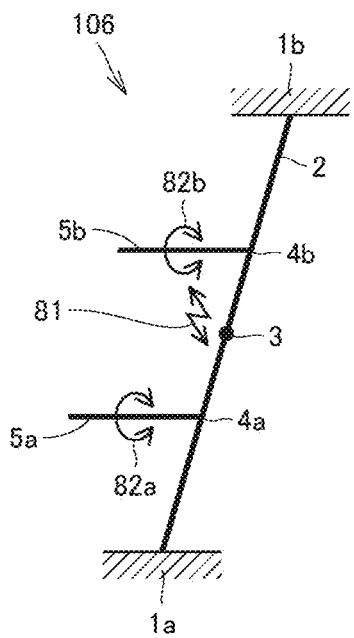
FIG. 6 is a conceptual view of a second example of the resonators of the third embodiment according to the present invention.

Referring to FIGS. 5 and 6, resonators of a third embodiment according to the present invention will be described. As shown in FIG. 5, a resonator 105, which is a first example of the resonators of the present embodiment, includes a base 1; a first beam 2 having one end fixed to base 1, and having a vibration receiving location 3 for providing linear reciprocating motion in a direction perpendicular to the longitudinal direction thereof; and a plurality of second beams 5a, 5b, branching toward one side from a plurality of branching locations 4a, 4b different from vibration receiving location 3 in first beam 2, for generating torsional vibration in accordance with the linear reciprocating motion.

As shown in FIG. 6, a resonator 106, which is a second example of the resonators of the present embodiment, has a first beam 2 having one end fixed to a base 1a and the other end fixed to a base 1b. Configurations of other portions are the same as those of resonator 105 serving as the first example of the present embodiment.

(Function and Effect)

In each of resonators 105, 106 of the present embodiment, at vibration receiving location 3, first beam 2 is provided with linear reciprocating motion in a direction perpendicular to the longitudinal direction of first beam 2 as indicated by an arrow 81, thereby transversely vibrating first beam 2. On this occasion, the plurality of second beams 5a, 5b, each of which has its one end bound to first beam 2 via branching location 4a or 4b, are displaced following the transverse vibration of first beam 2, thereby generating torsional vibrations in the plurality of second beams 5a, 5b as indicated by arrows 82a, 82b respectively.

The torsional vibrations are utilized in the same way as described in the first embodiment.

Fourth Embodiment

Configuration

Figure 7:
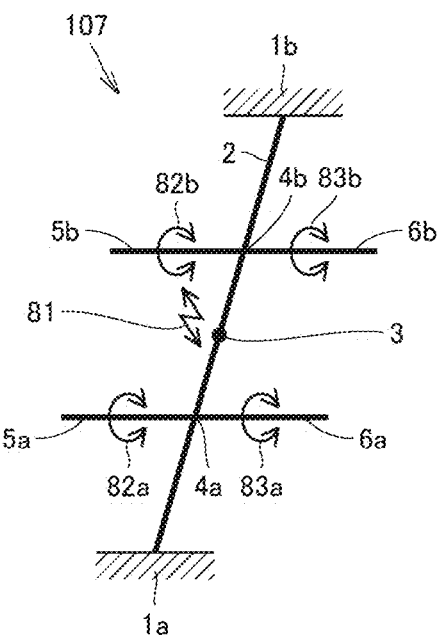
FIG. 7 is a conceptual view of a resonator of a fourth embodiment according to the present invention.

Referring to FIG. 7, a resonator of a fourth embodiment according to the present invention will be described. As shown in FIG. 7, resonator 107 of the present embodiment includes a plurality of third beams 6a, 6b, extending from a plurality of branching locations 4a, 4b to a side opposite to a plurality of second beams 5a, 5b, for generating torsional vibration. Configurations of other portions are the same as those of resonator 106 shown in the third embodiment.

(Function and Effect)

In resonator 107 of the present embodiment, at vibration receiving location 3, first beam 2 is provided with linear reciprocating motion in a direction perpendicular to the longitudinal direction of first beam 2 as indicated by an arrow 81, thereby transversely vibrating first beam 2. On this occasion, the plurality of second beams 5a, 5b, each of which has its one end bound to first beam 2 via branching location 4a or 4b, are displaced following the transverse vibration of first beam 2, thereby generating torsional vibrations in the plurality of second beams 5a, 5b as indicated by arrows 82a, 82b respectively. Likewise, the plurality of third beams 6a, 6b are also bounded to first beam 2 via the plurality of branching locations 4a, 4b and are therefore displaced following the transverse vibration of first beam 2, thereby generating torsional vibrations in the plurality of third beams 6a, 6b as indicated by arrows 83a, 83b respectively.

The torsional vibrations are utilized in the same way as described in the first embodiment.

Fifth Embodiment

Configuration

Figure 8:
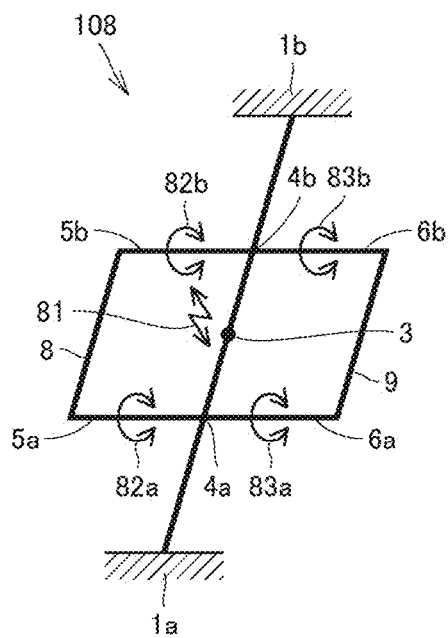
FIG. 8 is a conceptual view of a first example of resonators of a fifth embodiment according to the present invention.
Figure 9:
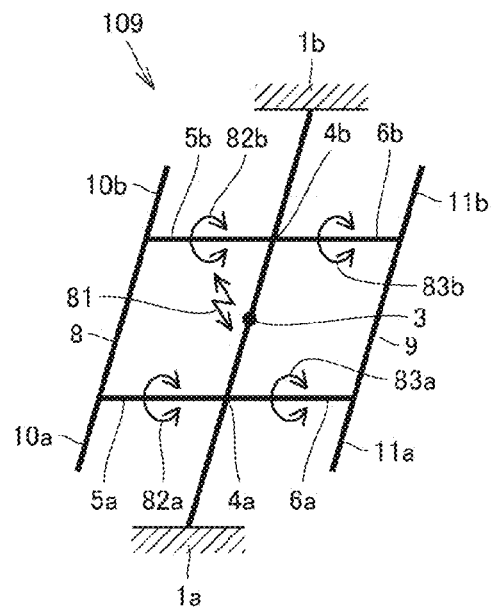
FIG. 9 is a conceptual view of a second example of the resonators of the fifth embodiment according to the present invention.

Referring to FIGS. 8 and 9, resonators of a fifth embodiment according to the present invention will be described. As shown in FIG. 8, a resonator 108, which is a first example of the resonators of the present embodiment, includes a plurality of second beams 5a, 5b having their tips coupled to each other via a fourth beam 8; and a plurality of third beams 6a, 6b having their tips coupled to each other via a fifth beam 9. Configurations of other portions are the same as those in resonator 107 illustrated in the fourth embodiment.

As shown in FIG. 9, a resonator 109, which is a second example of the resonators of the present embodiment, includes a fourth beam 8 and a fifth beam 9, each of which has opposite ends projecting as free ends. The opposite ends of fourth beam 8 serve as projections 10a, 10b respectively. The ends of projections 10a, 10b are free ends. Thus, each of projections 10a, 10b is in a state of cantilever. The opposite ends of fifth beam 9 are projections 11a, 11b respectively. The ends of projections 11a, 11b are free ends. Thus, each of projections 11a, 11b is in a state of cantilever. Configurations of other portions are the same as those in resonator 107 illustrated in the fourth embodiment.

It should be noted that in FIG. 9, the respective lengths of projections 10a, 10b, 11a, 11b seem the same but may be different from one another. Further, the present invention is not limited to the configuration having projections at all the corners. A configuration having a corner with a projection and a corner with no projection is conceivable.

(Function and Effect)

In each of resonators 108, 109 of the present embodiment, at vibration receiving location 3, first beam 2 is provided with linear reciprocating motion in a direction perpendicular to the longitudinal direction of first beam 2 as indicated by an arrow 81, thereby transversely vibrating first beam 2. On this occasion, the plurality of second beams 5a, 5b, each of which has its one end bound to first beam 2 via branching location 4a or 4b, are displaced following the transverse vibration of first beam 2, thereby generating torsional vibrations in the plurality of second beams 5a, 5b as indicated by arrows 82a, 82b respectively. Likewise, since the plurality of third beams 6a, 6b are also bounded to first beam 2 via the plurality of branching locations 4a, 4b, the plurality of third beams 6a, 6b are displaced following the transverse vibration of first beam 2, thereby generating torsional vibrations in the plurality of third beams 6a, 6b as indicated by arrows 83a, 83b respectively. The tips of second beams 5a, 5b are coupled to each other via fourth beam 8, so torsional vibrations generated in second beams 5a, 5b affect each other by fourth beam 8. The same holds true for third beams 6a, 6b having their tips coupled to each other via fifth beam 9.

The torsional vibrations are utilized in the same way as described in the first embodiment.

In particular, resonators including the closed-loop structure such as resonators 108, 109 illustrated in the present embodiment can exhibit an effect of confinement of vibration energy. This leads to a high Q factor in such resonators.

Sixth Embodiment

Configuration

Figure 10:
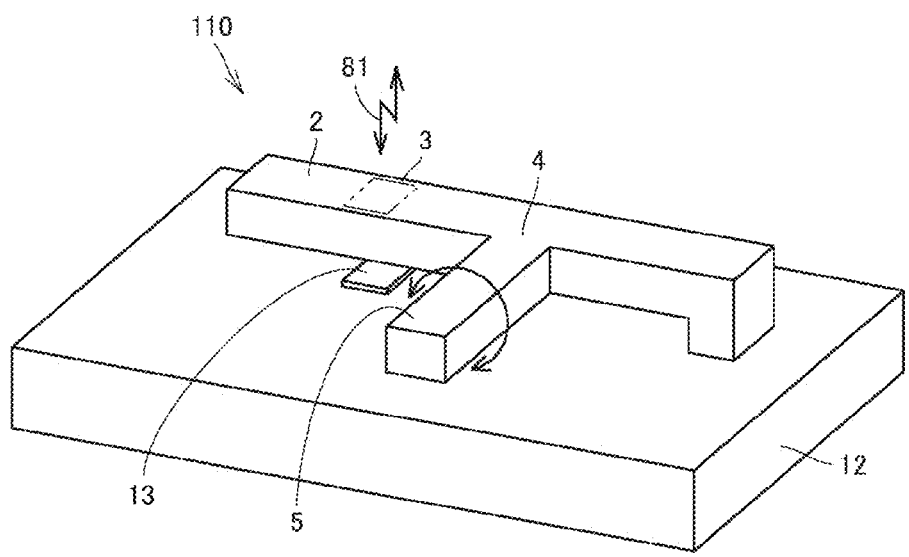
FIG. 10 is a conceptual view of a first example of resonators of a sixth embodiment according to the present invention.
Figure 11:
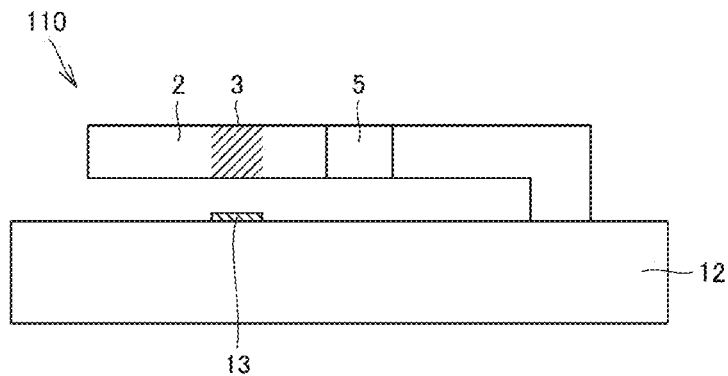
FIG. 11 is a side view of the resonator shown in FIG. 10.

Referring to FIGS. 10-13, resonators of a sixth embodiment according to the present invention will be described. As shown in FIG. 10, a resonator 110, which is a first example of the resonators of the present embodiment, includes a base that is a substrate 12, and a first beam 2 that is distant away from substrate 12 but extending in parallel with a surface of substrate 12. A vibration receiving location 3 is an area of square of 10 µm×10 µm, for example. FIG. 11 shows a side view of resonator 110. Resonator 110 is a structure corresponding to resonator 101 illustrated in the first embodiment.

Figure 12:
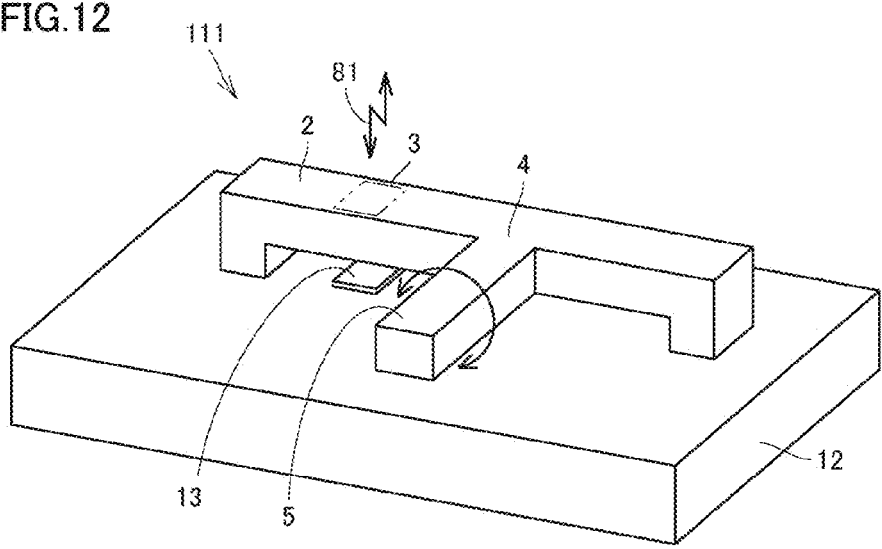
FIG. 12 is a conceptual view of the first example of the resonators of the sixth embodiment according to the present invention.
Figure 13:
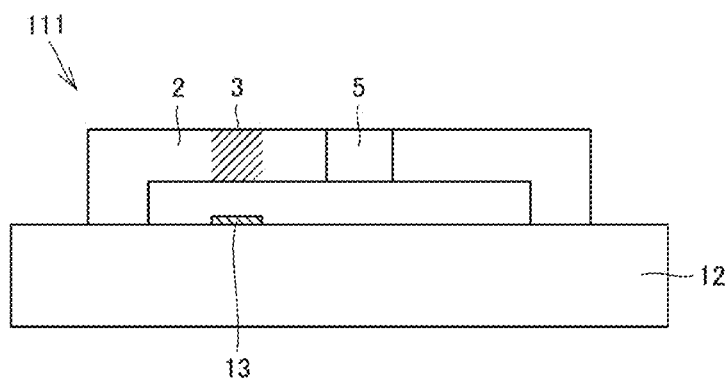
FIG. 13 is a side view of the resonator shown in FIG. 12.

As shown in FIG. 12, a resonator 111 of a second example of the resonators of the present embodiment includes a base that is a substrate 12, and a first beam 2 that is distant away from substrate 12 but extending in parallel with a surface of substrate 12. FIG. 13 shows a side view of resonator 111. Resonator 111 is a structure corresponding to resonator 102 illustrated in the first embodiment.

(Function and Effect)

In the present embodiment, linear reciprocating motion is provided and torsional vibration is generated in resonators 110, 111 in the same manners as described in the first embodiment. In resonators 110, 111 of the present embodiment, each beam is formed on and above the surface of the substrate. Hence, they can be readily fabricated on the substrate by film formation and etching as described below.

An advantage of utilizing the torsional vibration as the vibration of each resonator, and utilization thereof for the resonator are the same as described in the first embodiment.

In each of the resonators of the present embodiment, the surface of substrate 12 has a location facing vibration receiving location 3 and provided with an electrode 13. Electrode 13 is preferably operative to generate electrostatic force between electrode 13 and vibration receiving location 3 to provide first beam 2 with linear reciprocating motion. With such a configuration, linear reciprocating motion can be readily and securely provided thereto at vibration receiving location 3.

Seventh Embodiment

Configuration

Figure 14:
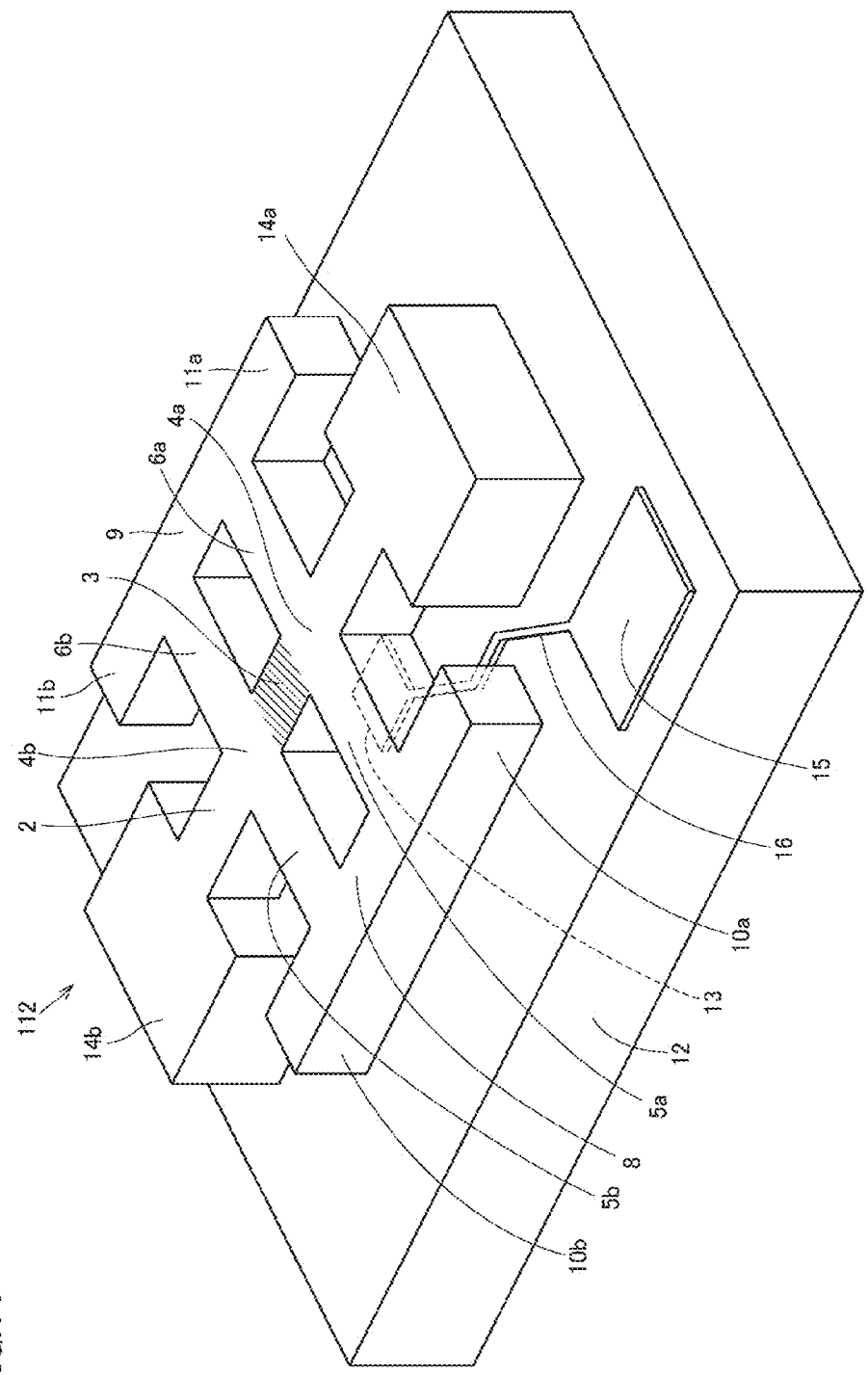
FIG. 14 is a perspective view of a resonator of a seventh embodiment according to the present invention.

Referring to FIG. 14, a resonator of a seventh embodiment according to the present invention will be described. As shown in FIG. 14, resonator 112 of the present embodiment is a structure corresponding to resonator 109 illustrated in the fifth embodiment. Specifically, resonator 112 includes a substrate 12 serving as a base; a first beam 2 having opposite ends fixed to substrate 12, and having a vibration receiving location 3 for providing linear reciprocating motion in a direction perpendicular to the longitudinal direction thereof; and a plurality of second beams 5a, 5b, branching toward one side from a plurality of branching locations 4a, 4b different from vibration receiving location 3 in first beam 2, for generating torsional vibration in accordance with the linear reciprocating motion. In fixing the opposite ends of first beam 2 to substrate 12, they are not directly connected to the main body of substrate 12, but are connected thereto via fixed connection portions 14a, 14b formed on the upper surface of substrate 12. Fixed connection portions 14a, 14b may be formed of the same material as that of first beam 2. Fixed connection portions 14a, 14b work together with substrate 12 to serve as fixed ends for the opposite ends of first beam 2.

Resonator 112 includes a plurality of third beams 6a, 6b, extending from the plurality of branching locations 4a, 4b toward a side opposite to the plurality of second beam 5a, 5b, for generating torsional vibration. In resonator 112, the plurality of second beams 5a, 5b have their tips coupled to each other via a fourth beam 8, and the plurality of third beams 6a, 6b have their tips coupled to each other via a fifth beam 9. Each of fourth beam 8 and fifth beam 9 has opposite ends projecting as free ends. The opposite ends of fourth beam 8 are projections 10a, 10b respectively.

As indicated by a dashed line in FIG. 14, an electrode 13 is provided on the upper surface of substrate 12 at a location corresponding to vibration receiving location 3 of first beam 2. From electrode 13, a wire 16 is drawn. On the surface of substrate 12, a pad 15 is provided at a location where it is not covered with each of the beams when viewed from above. Wire 16 extends along the surface of substrate 12 to electrically connect electrode 13 and pad 15 to each other. Electrode 13 is operative to generate electrostatic force between electrode 13 and vibration receiving location 3 to provide first beam 2 with linear reciprocating motion. Vibration receiving location 3 may be an area with four sides each having a length of 10 μm, for example. Substrate 12 may be a glass substrate or a gallium arsenide (GaAs) substrate, for example. First beam 2 and the like may be disposed with a space of for example 2 μm from the surface of substrate 12. Electrode 13 is formed of gold, for example.

(Function and Effect)

In resonator 112 of the present embodiment, a certain voltage is applied between pad 15 and first beam 2 to cause a potential difference between electrode 13 and vibration receiving location 3 of first beam 2. The voltage thus applied between pad 15 and first beam 2 may be for example 1-2 V. The potential difference between electrode 13 and vibration receiving location 3 causes generation of electrostatic force between electrode 13 and vibration receiving location 3. The electrostatic force provides linear reciprocating motion to vibration receiving location 3 of first beam 2. Accordingly, first beam 2 is transversely vibrated. On this occasion, torsional vibrations take place in the plurality of second beams 5a, 5b and the plurality of third beams 6a, 6b.

Figure 15:
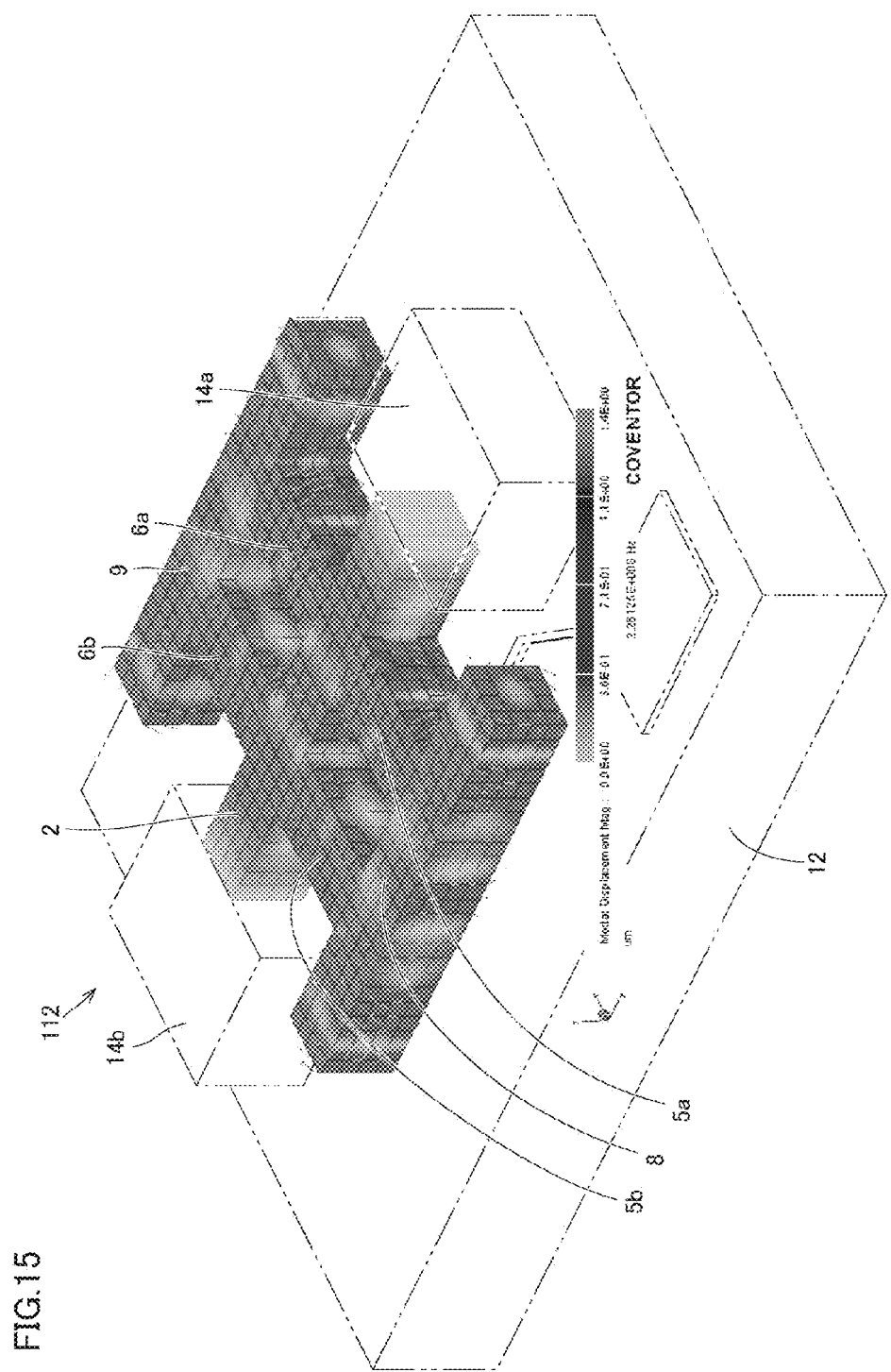
FIG. 15 is a first schematic view showing how the resonator of the seventh embodiment according to the present invention is vibrated.
Figure 16:
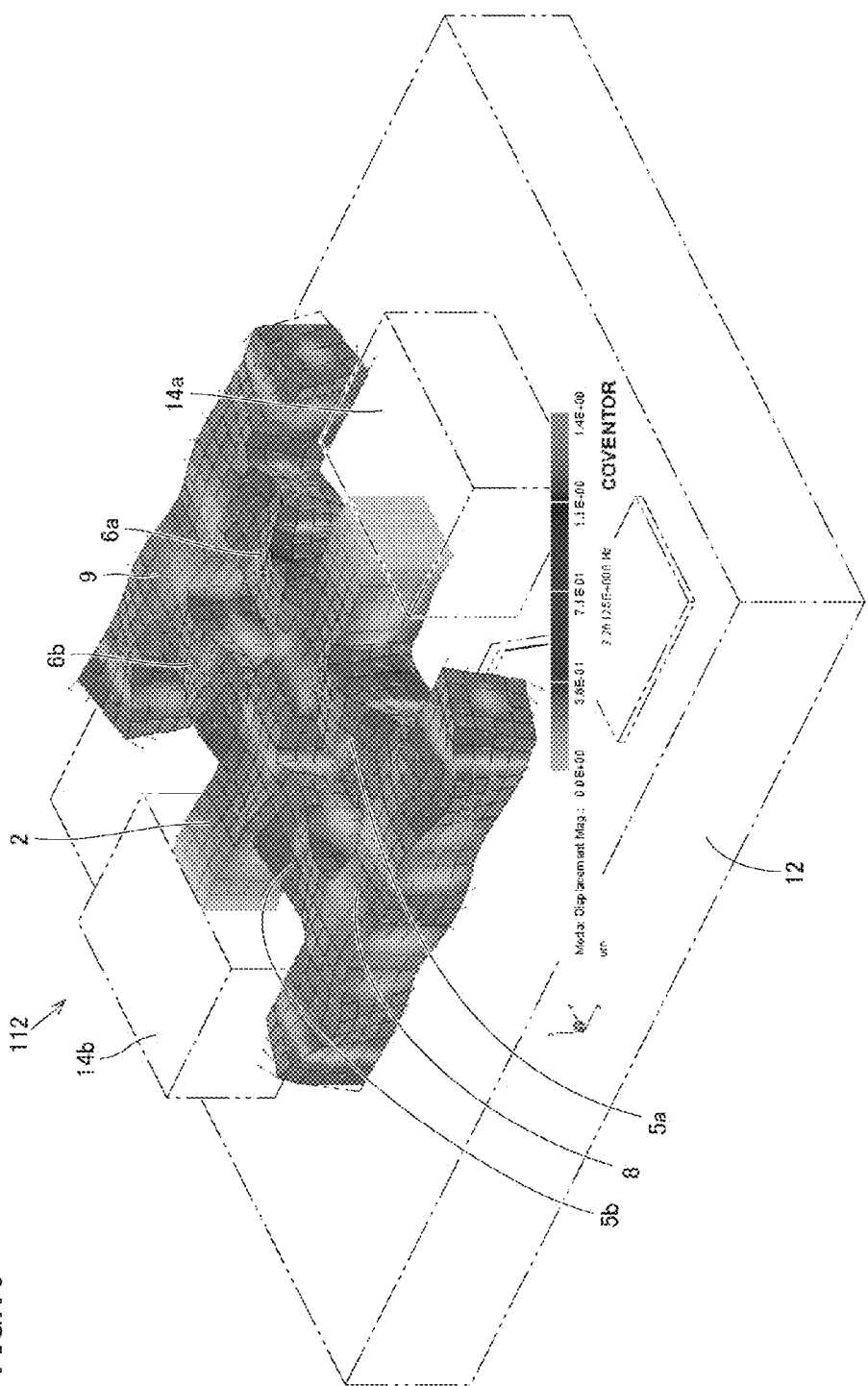
FIG. 16 is a second schematic view showing how the resonator of the seventh embodiment according to the present invention is vibrated.
Figure 17:
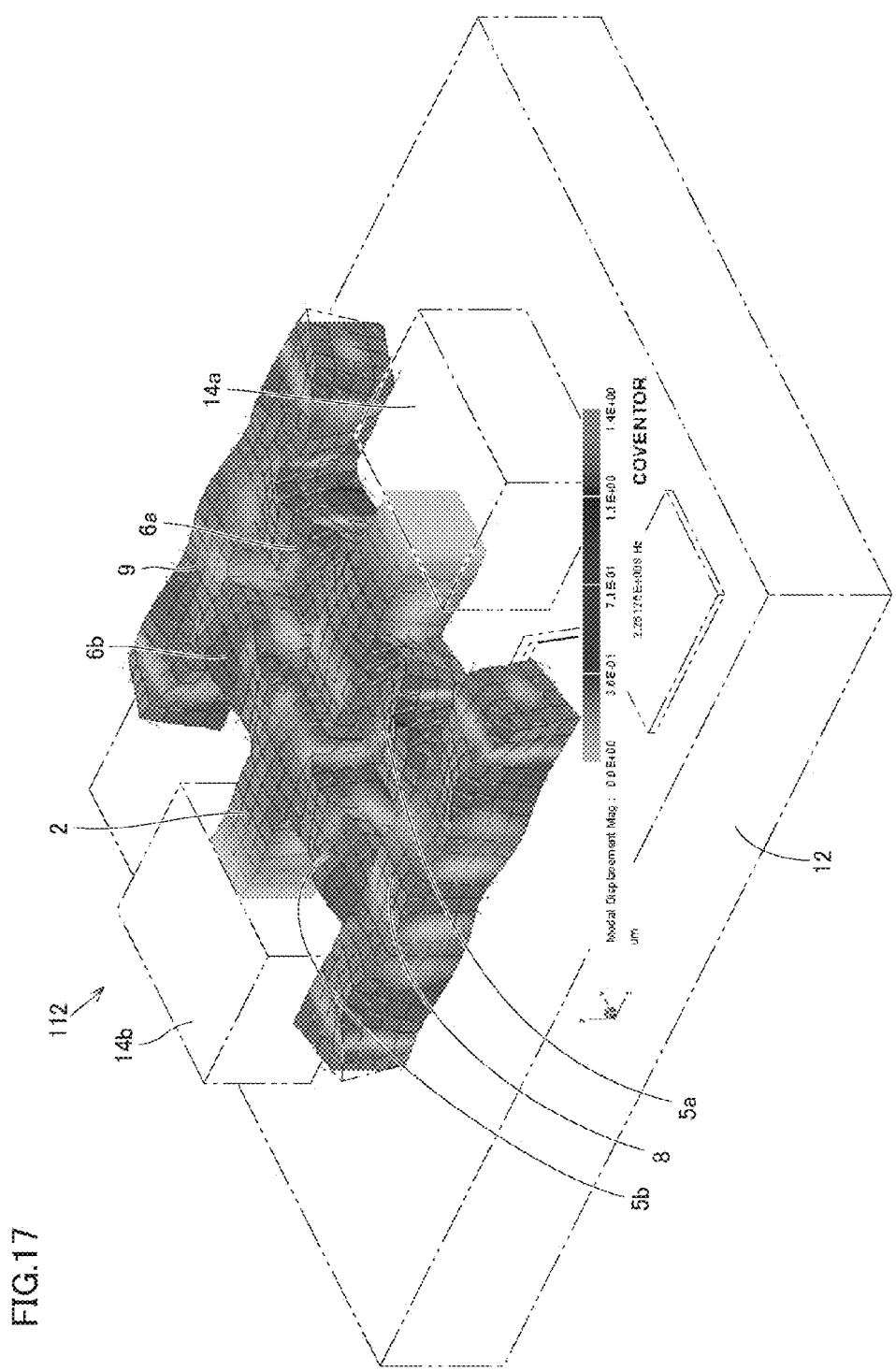
FIG. 17 is a third schematic view showing how the resonator of the seventh embodiment according to the present invention is vibrated.

FIGS. 15-17 show how resonator 112 vibrates. FIGS. 15-17 show deformation thereof based on a simulation result obtained by a computer. For ease of description, the degree of deformation of each of the beams in FIGS. 16 and 17 is illustrated with exaggeration. The entire resonator 112 torsionally and transversely vibrates repeatedly by being brought into the following states sequentially:

. . . →FIG. 15→FIG. 16→FIG. 15→FIG. 17→FIG. 15→FIG. 16→FIG. 15→FIG. 17→FIG. 15→FIG. 16→FIG. 15→FIG. 17→FIG. 15→FIG. 16→FIG. 15→ . . . .

As shown in FIGS. 15 and 16, torsional vibrations take place in the plurality of second beams 5a, 5b and the plurality of third beams 6a, 6b.

It should be noted that a multiplicity of small arrows are illustrated in FIGS. 15-17 at the surface of each beam for convenience of the simulation.

The simulation result presented herein is a mere example, and the mode of vibration can be appropriately changed by changing parameters such as the intensity of a signal provided to pad 15, the frequency thereof, the length of each beam, the positioning of the branching locations, the number of beams branching therefrom, the angle of each of the branching beams, and the cross sectional shape of each beam.

Now, in torsional vibration, a portion repeatedly displaced in the torsion direction greatly is regarded as a "loop", and a portion not displaced in the torsion direction is regarded as a "node". The number of loops and nodes appearing in one beam can differ depending on the mode of vibration. In the example described herein, the number of the plurality of second beams 5a, 5b are two and the number of the plurality of third beams 6a, 6b are also two, but the number of each of them may be any number other than two.

An advantage of utilizing such generated torsional vibration as vibration of the resonator, and utilization thereof for the resonator are the same as described in the first embodiment. Vibration energy stored in the vibrating portions as a result of the torsional vibrations of the plurality of second beams 5a, 5b and the plurality of third beams 6a, 6b can be electrically extracted through electrode 13 and pad 15.

The configuration in which the opposite ends of first beam 2 are fixed to substrate 12 is presented herein, but a configuration in which only one end of first beam 2 is fixed to substrate 12 can be conceived as a variation.

(Manufacturing Method)

Referring to FIGS. 18-32, a method for manufacturing the resonator of the present embodiment will be described. In the description below, the words "upper" and "lower" are used in a relative sense for ease of description, and are not necessarily used in an absolute sense to indicate the upper and lower directions.

Figure 18:
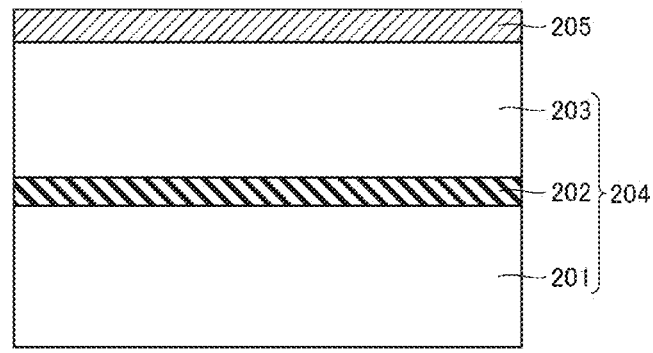
FIG. 18 is a schematic view of a first process of a method for manufacturing the resonator of the present embodiment.

First, as shown in FIG. 18, chromium is deposited on the upper surface of an SOI wafer 204 to form a Cr film 205. In SOI wafer 204, an $SiO_2$ layer 202 is provided on an Si layer 201, and an Si layer 203 is formed on $SiO_2$ layer 202. Si layer 203 has a thickness of for example 10 μm. Cr film 205 is formed on the upper surface of Si layer 203. Cr layer 205 has a thickness of for example 500 Å.

Figure 19:
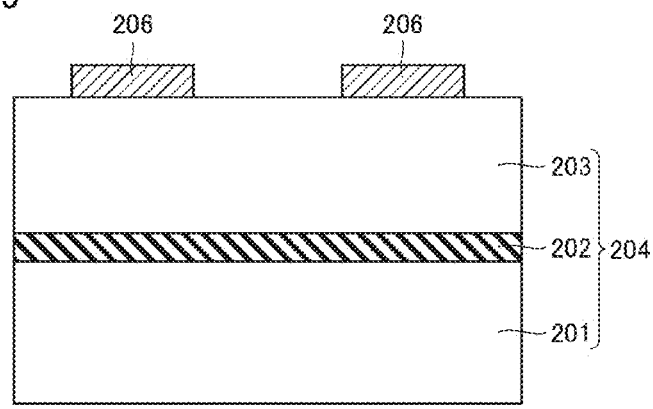
FIG. 19 is a schematic view of a second process of the method for manufacturing the resonator of the present embodiment.
Figure 20:
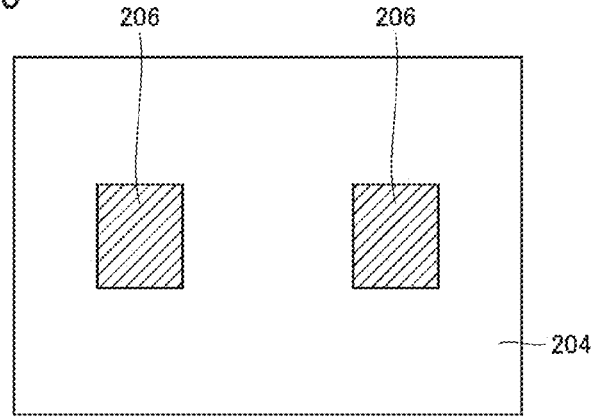
FIG. 20 is a plan view corresponding to FIG. 19.

As shown in FIG. 19, Cr film 205 is subjected to first photolithography to form Cr film patterns 206. FIG. 20 shows a plan view of this state. Cr film patterns 206 are formed in the form of islands at two locations, for example. Cr film patterns 206 correspond to areas in which fixed connection portions 14a, 14b will be formed.

Figure 21:
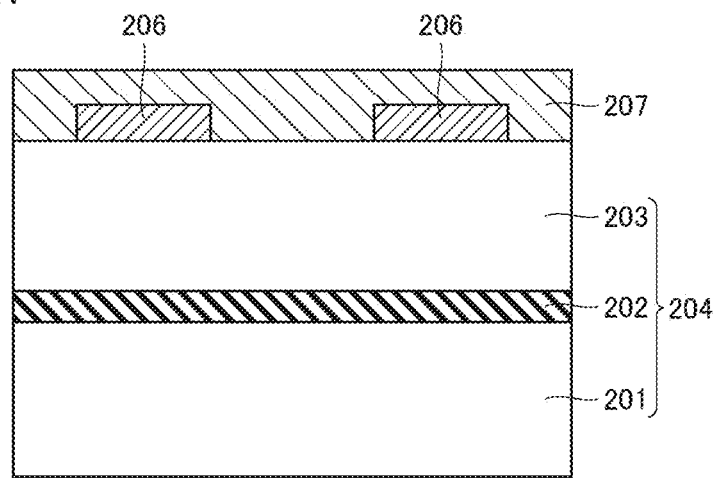
FIG. 21 is a schematic view of a third process of the method for manufacturing the resonator of the present embodiment.

As shown in FIG. 21, aluminum is deposited on the upper surface of Si layer 203 to form an Al film 207 that completely covers Cr film pattern 206. Al film 207 has a thickness of for example 1000 Å.

Figure 22:
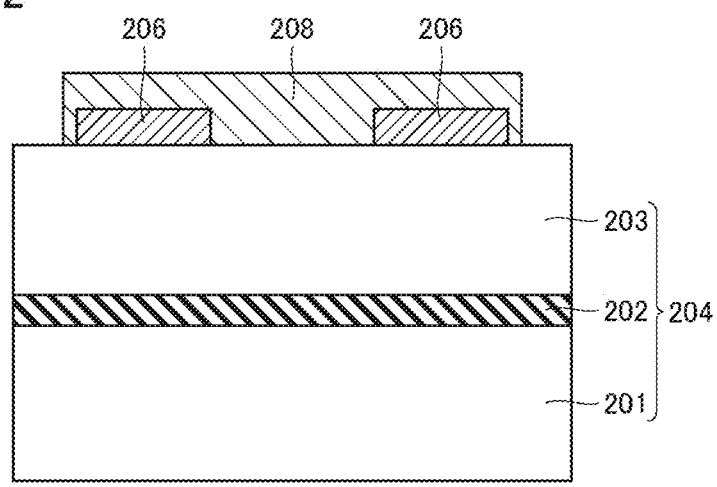
FIG. 22 is a schematic view of a fourth process of the method for manufacturing the resonator of the present embodiment.
Figure 23:
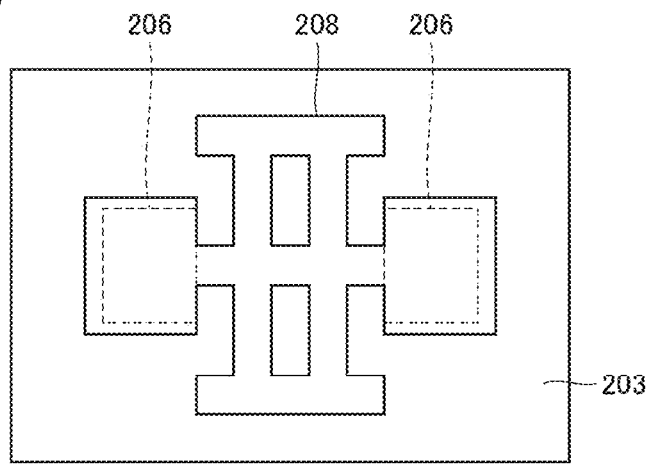
FIG. 23 is a plan view corresponding to FIG. 22.

As shown in FIG. 22, Al film 207 is subjected to second photolithography to form an Al film pattern 208, which is left according to a certain pattern. FIG. 23 shows a plan view of this state. Al film pattern 208 has a planar shape including portions corresponding to the beams of the resonator.

Figure 24:
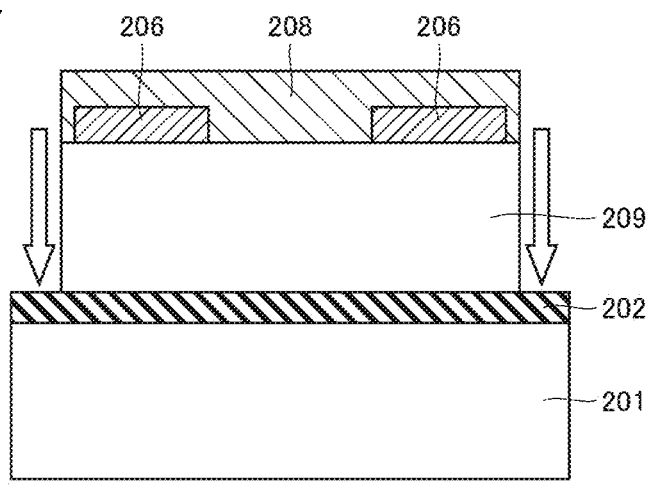
FIG. 24 is a schematic view of a fifth process of the method for manufacturing the resonator of the present embodiment.
Figure 25:
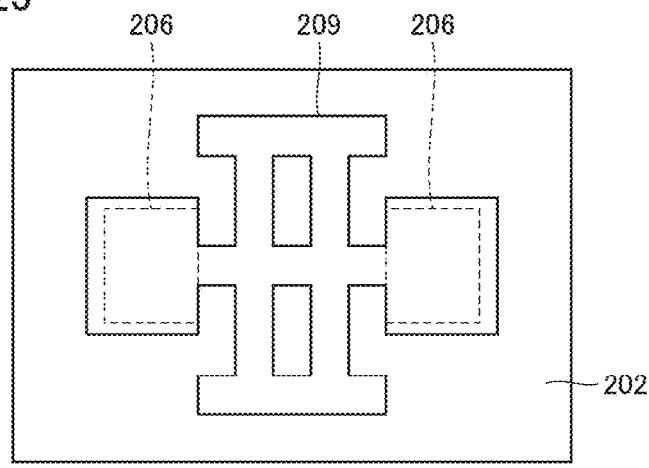
FIG. 25 is a plan view corresponding to FIG. 24.

Then, using Al film pattern 208 as a mask, Si layer 203 (see FIG. 22) is subjected to dry etching. As shown in FIG. 24, areas not covered with Al film pattern 208 in Si layer 203 are removed to expose $SiO_2$ layer 202. In this example, since Si layer 203 has a thickness of 10 μm, the dry etching is performed up to a depth of approximately 10 μm. By this dry etching, a Si layer pattern 209 is formed. FIG. 25 shows a plan view of this state. Si layer pattern 209 has a planar shape including portions corresponding to the beams of the resonator. On this occasion, Cr film patterns 206 are not exposed because they are within Al film pattern 208.

Figure 26:
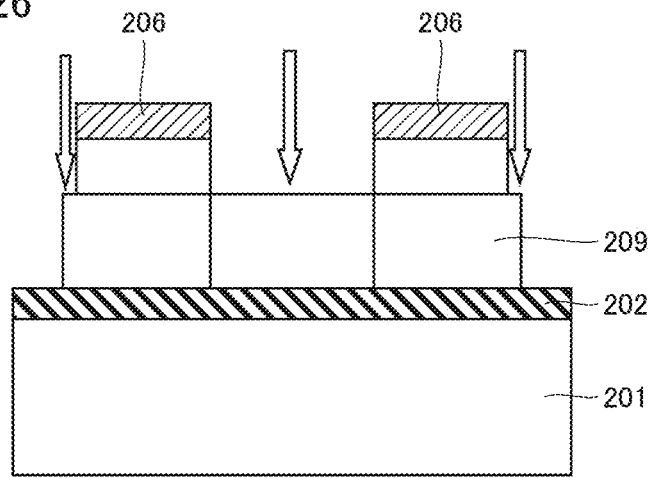
FIG. 26 is a schematic view of a sixth process of the method for manufacturing the resonator of the present embodiment.

Then, Al film pattern 208 (see FIG. 24) is removed, and Si layer pattern 209 is subjected to dry etching using Cr film patterns 206 as masks as shown in FIG. 26. The dry etching thus performed is ICP (Inductively Coupled Plasma) etching. By the dry etching, areas not covered with Cr film patterns 206 in Si layer pattern 209 are etched away by for example 4 μm from the upper surface thereof. Then, Cr film patterns 206 are removed, thereby obtaining a structure shown in FIG. 27. FIG. 28 shows a plan view of this state. On this occasion, in this structure, Si layer pattern 209 is on $SiO_2$ layer 202 and includes low portions 209a and high portions 209b. High portions 209b are portions that used to be covered with Cr film patterns 206.

Figure 29:
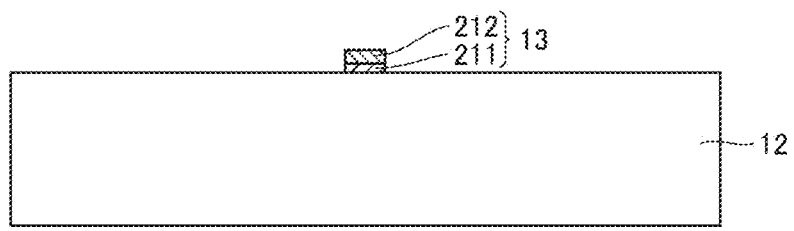
FIG. 29 is a schematic view of an eighth process of the method for manufacturing the resonator of the present embodiment.
Figure 30:
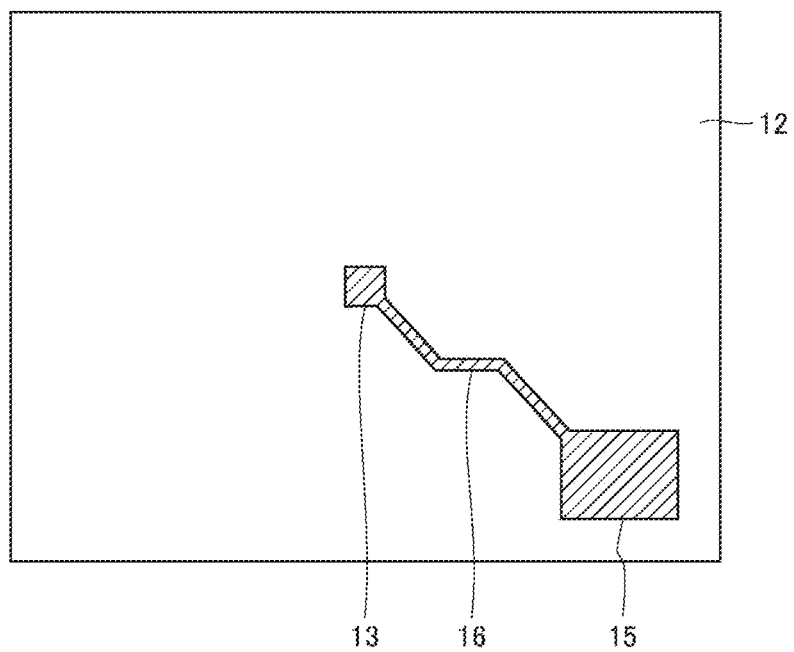
FIG. 30 is a plan view corresponding to FIG. 29.

Meanwhile, a chromium film is formed as a seed layer on the upper surface of substrate 12, which is a separately prepared glass substrate. Then, a gold layer is formed to entirely cover the chromium layer. These metal layers are patterned to form a stacked-layer pattern in which Au layer 212 is on the upper side of Cr layer 211 as shown in FIG. 29. FIG. 30 shows a plan view of this state. At the center of substrate 12, electrode 13 is disposed to provide linear reciprocating motion to the beams by means of electrostatic force. Adjacent to an end of substrate 12, pad 15 is disposed. Electrode 13 and pad 15 are electrically connected to each other via wire 16. Electrode 13, pad 15, and wire 16 are formed in one piece, and each of them is constituted by the two-layer structure of Au/Cr.

Figure 27:
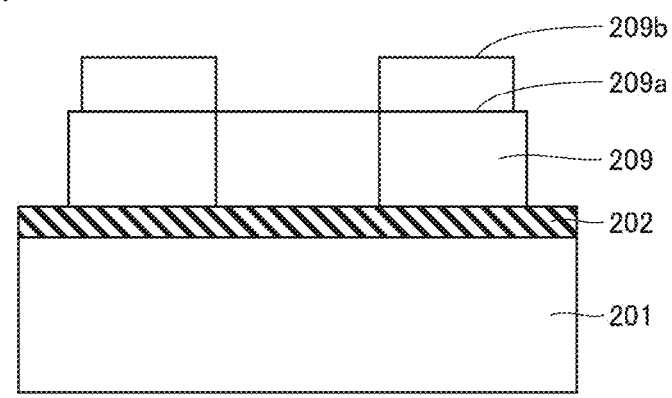
FIG. 27 is a schematic view of a seventh process of the method for manufacturing the resonator of the present embodiment.
Figure 28:
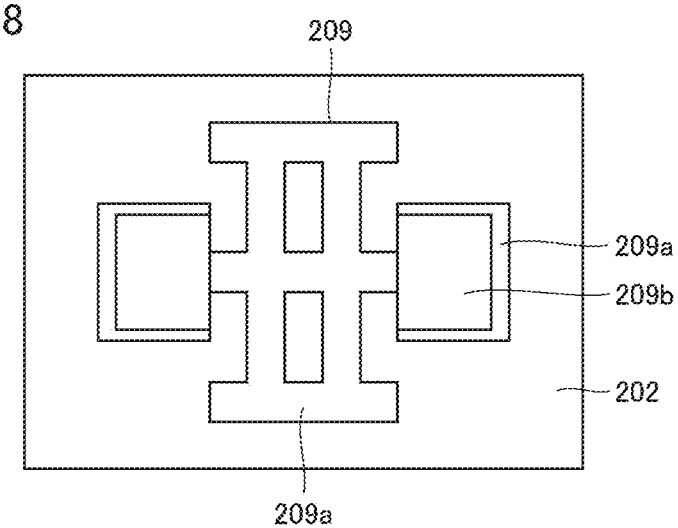
FIG. 28 is a plan view corresponding to FIG. 27.
Figure 31:
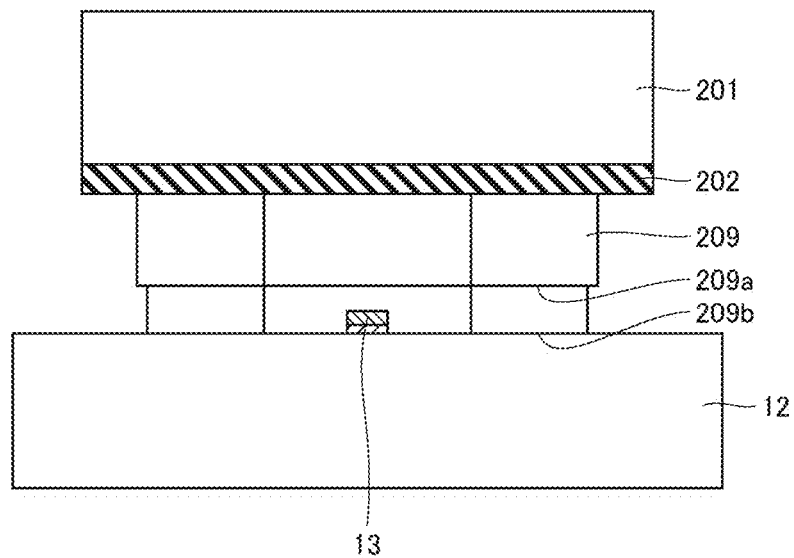
FIG. 31 is a schematic view of a ninth process of the method for manufacturing the resonator of the present embodiment.
Figure 32:
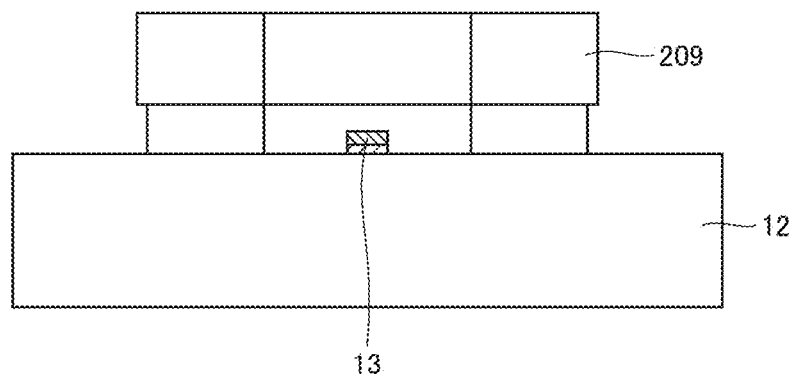
FIG. 32 is a schematic view of a tenth process of the method for manufacturing the resonator of the present embodiment.

Then, the structure shown in FIG. 27 is turned upside down, and is bonded to the structure shown in FIG. 29. The bonding is achieved by anode bonding. As a result, a structure shown in FIG. 31 is obtained. High portions 209b of Si layer pattern 209 are bonded to the surface of the substrate 12, and low portions 209a are distant away from the surface of substrate 12. Thereafter, Si layer 201 is removed by etching. Then, $SiO_2$ layer 202 is removed by etching. As a result, a structure shown in FIG. 32 is obtained. Namely, resonator 112 shown in FIG. 14 is obtained.

Eighth Embodiment

Resonator Array

Figure 33:
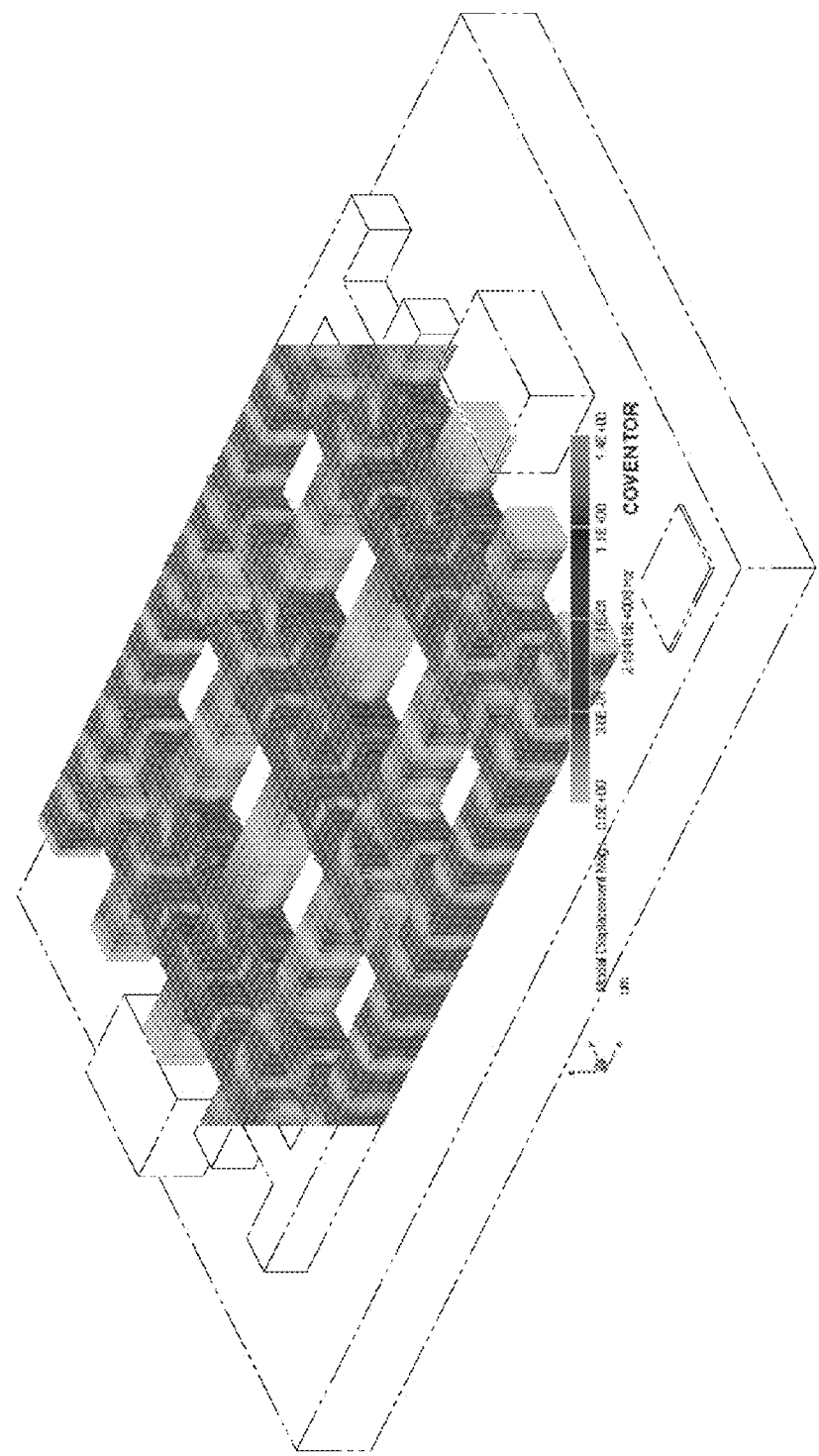
FIG. 33 is a perspective view of a resonator array of an eighth embodiment according to the present invention.

Referring to FIG. 33, a resonator array according to an eighth embodiment of the present invention will be described. The resonator array of the present embodiment is formed as follows. In the resonator described in any of the above-described embodiments, the locations to be fixed to the base(s) and the locations to be the free ends are replaced with connection portions for adjacent resonators, and a plurality of such resonators are connected to one another. Namely, the resonator array is such as the one shown in FIG. 33. In the description herein, there are five projections in the front side thereof and there are also five projections in the back side. A projection at the center in each of the front side and the back side is to serve as a fixed end. The number of the fixed ends and the locations of the fixed ends may differ. A structure may be employed which includes some substrate, by which the resonator array is supported, as shown in FIG. 33. In this case, the resonator array has portions other than the connection portions for supporting and disposed distant away from and in parallel with the surface of the substrate. Further, the resonator array may be supported by some means without using such a substrate.

(Function and Effect)

Figure 34:
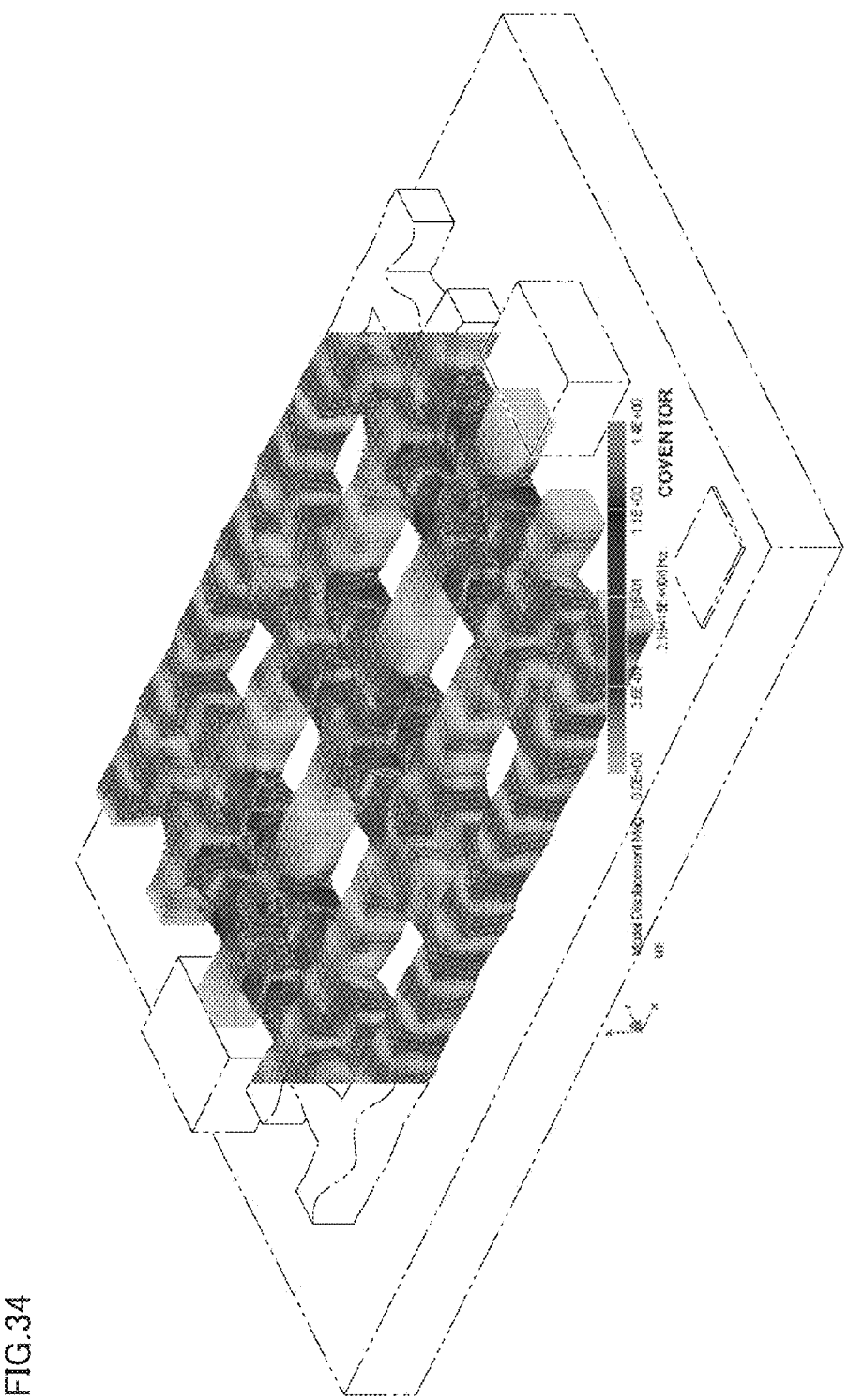
FIG. 34 is a first schematic view showing how the resonator array of the eighth embodiment according to the present invention is vibrated.
Figure 35:
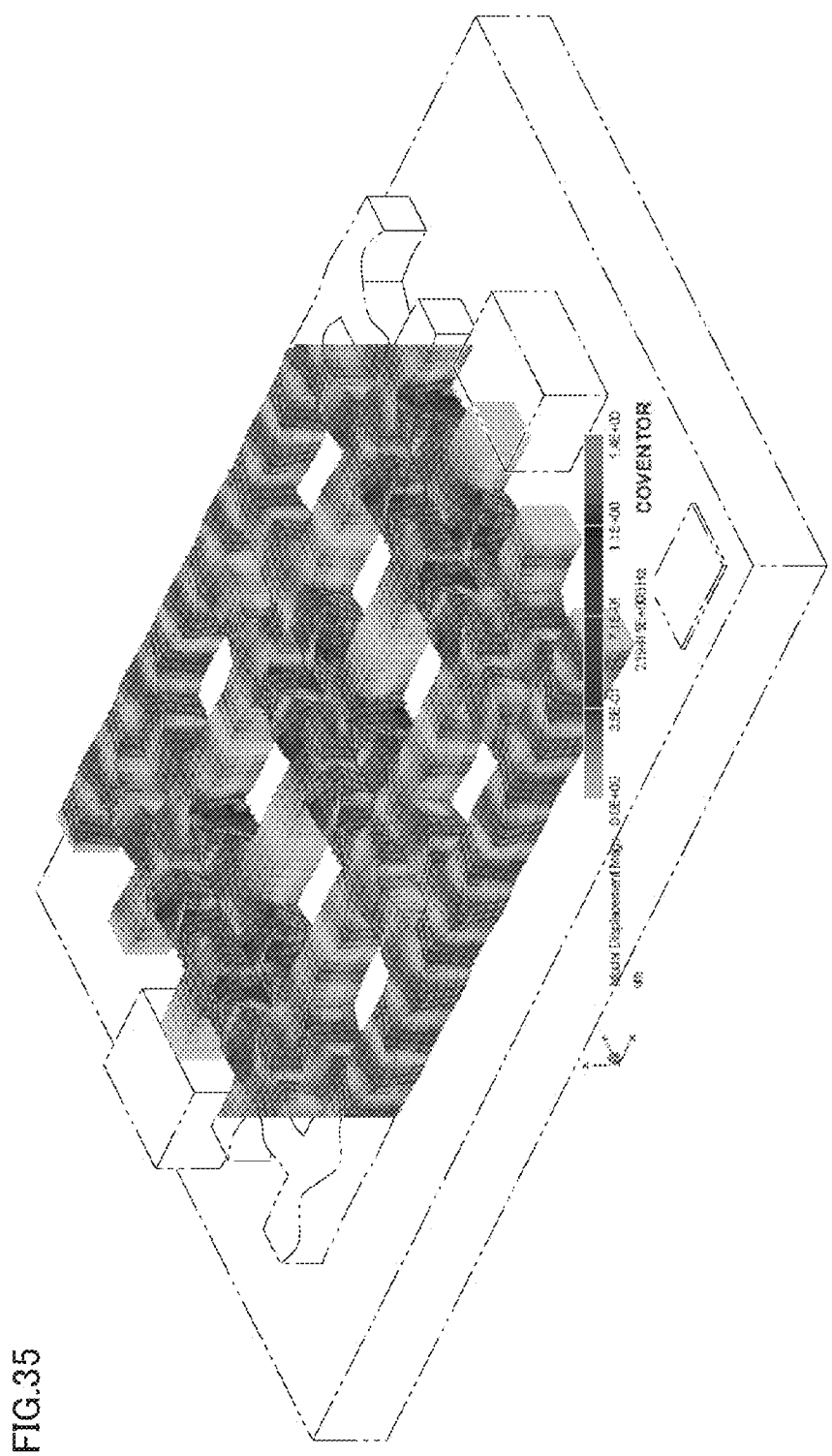
FIG. 35 is a second schematic view showing how the resonator array of the eighth embodiment according to the present invention is vibrated.

In this resonator array, linear reciprocating vibration is provided to one or more locations in each beam to generate vibration. On this occasion, torsional vibration takes place in a part of the beams. For example, deformation takes place as shown in FIGS. 34 and 35. The entire resonator array torsionally and transversely vibrates repeatedly by being brought into the following states sequentially:

. . . →FIG. 33→FIG. 34→FIG. 33→FIG. 35→FIG. 33→FIG. 34→FIG. 33→FIG. 35→FIG. 33→FIG. 34→FIG. 33→FIG. 35→FIG. 33→FIG. 34→ . . . .

The resonator array of the present embodiment can be used as a resonator by causing vibrations at a multiplicity of locations at the same time. Further, the grids in the array may not be disposed at an equal interval, and may differ in length or cross sectional area depending on their sites so as to attain different resonance frequencies for the different sites in one resonator array. Unlike a mere collection and arrangement of different resonators, the plurality of resonator portions are connected to one another to constitute such an integrated resonator array, thus matching the phases of the vibrations of the resonator portions with one another. Now, such embodiments will be described below.

Ninth Embodiment

Configuration

Figure 39:
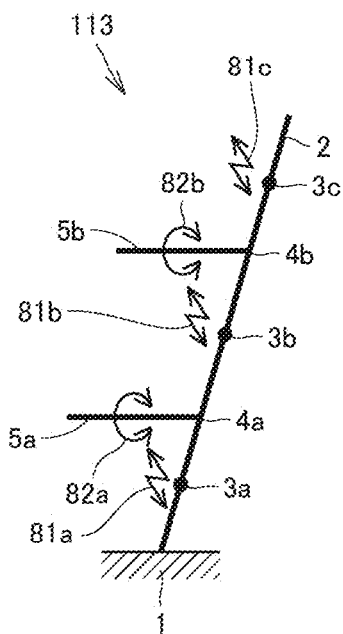
FIG. 39 is a conceptual view of a first example of resonators of a ninth embodiment according to the present invention.
Figure 40:
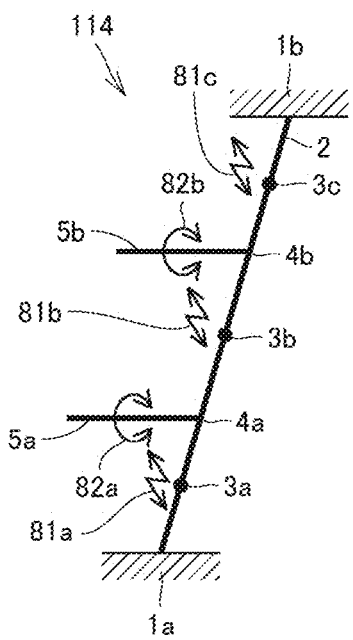
FIG. 40 is a conceptual view of a second example of the resonators of the ninth embodiment according to the present invention.

Referring to FIGS. 39 and 40, resonators of a ninth embodiment according to the present invention will be described. As shown in FIG. 39, a resonator 113, which is a first example of the resonators of the present embodiment, includes a base 1; a first beam 2 having one end fixed to base 1, and having a plurality of vibration receiving locations 3a, 3b, 3c for providing linear reciprocating motions in a direction perpendicular to the longitudinal direction thereof; and a plurality of second beams 5a, 5b, branching toward one side from a plurality of branching locations 4a, 4b different from the vibration receiving locations in first beam 2, for generating torsional vibrations in accordance with the linear reciprocating motions.

As shown in FIG. 40, a resonator 114, which is a second example of the resonators of the present embodiment, has a first beam 2 having one end fixed to a base 1a and the other end fixed to a base 1b. Configurations of other portions are the same as those in resonator 113 illustrated as the first example of the present embodiment.

(Function and Effect)

In each of resonators 113, 114 of the present embodiment, at the plurality of vibration receiving locations 3a, 3b, 3c, first beam 2 is provided with linear reciprocating motions in the direction perpendicular to the longitudinal direction of first beam 2 as indicated by arrows 81a, 81b, 81c, thereby transversely vibrating first beam 2.

When first beam 2 is transversely vibrated, the plurality of second beams 5a, 5b, each of which has its one end bound to first beam 2 via branching location 4a or 4b, are displaced following the transverse vibration of first beam 2, thereby generating torsional vibrations in the plurality of second beams 5a, 5b as indicated by arrows 82a, 82b respectively.

The torsional vibrations generated in this way are utilized as vibration of the resonator, thereby readily achieving a high resonance frequency without extreme downsizing of the resonator. Further, such a resonator employing torsional vibration can achieve a high Q factor.

The resonator can be utilized for a filter circuit or an oscillator.

Tenth Embodiment

Configuration

Figure 41:
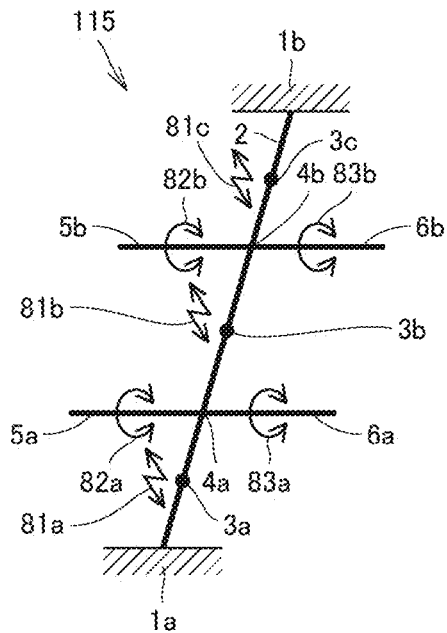
FIG. 41 is a conceptual view of a resonator of a tenth embodiment according to the present invention.

Referring to FIG. 41, a resonator of a tenth embodiment according to the present invention will be described. As shown in FIG. 41, resonator 115 of the present embodiment includes a plurality of third beams 6a, 6b, extending from a plurality of branching locations 4a, 4b to a side opposite to a plurality of second beams 5a, 5b, for generating torsional vibrations. Configurations of other portions are the same as those in resonator 114 illustrated in the ninth embodiment.

(Function and Effect)

In resonators 115 of the present embodiment, at a plurality of vibration receiving location 3a, 3b, 3c, first beam 2 is provided with linear reciprocating motions in the direction perpendicular to the longitudinal direction of first beam 2 as indicated by arrows 81a, 81b, 81c, thereby transversely vibrating first beam 2. On this occasion, the plurality of second beams 5a, 5b, each of which has its one end bound to first beam 2 via branching location 4a or 4b, are displaced following the transverse vibration of first beam 2, thereby generating torsional vibrations in the plurality of second beams 5a, 5b as indicated by arrows 82a, 82b respectively. Likewise, the plurality of third beams 6a, 6b are also bounded to first beam 2 via the plurality of branching locations 4a, 4b and are therefore displaced following the transverse vibration of first beam 2, thereby generating torsional vibrations in the plurality of third beams 6a, 6b as indicated by arrows 83a, 83b respectively.

The torsional vibrations are utilized in the same way as described in the ninth embodiment.

Eleventh Embodiment

Configuration

Figure 42:
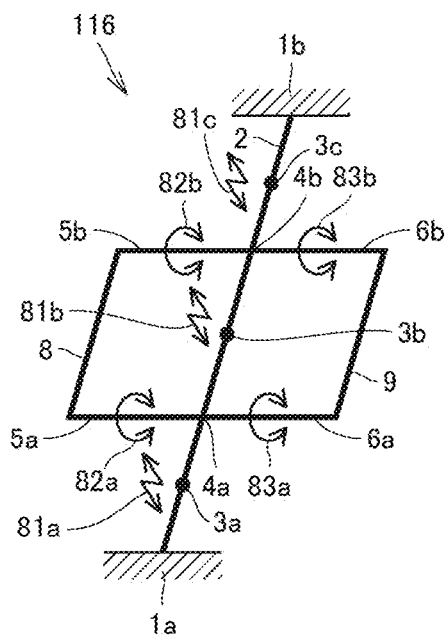
FIG. 42 is a conceptual view of a first example of resonators of an eleventh embodiment according to the present invention.

Referring to FIG. 42, resonators of an eleventh embodiment according to the present invention will be described. As shown in FIG. 42, a resonator 116, which is a first example of the resonators of the present embodiment, includes a plurality of second beams 5a, 5b having their tips coupled to each other via a fourth beam 8; and a plurality of third beams 6a, 6b having their tips coupled to each other via a fifth beam 9. Configurations of other portions are the same as those in resonator 115 illustrated in the tenth embodiment.

Figure 43:
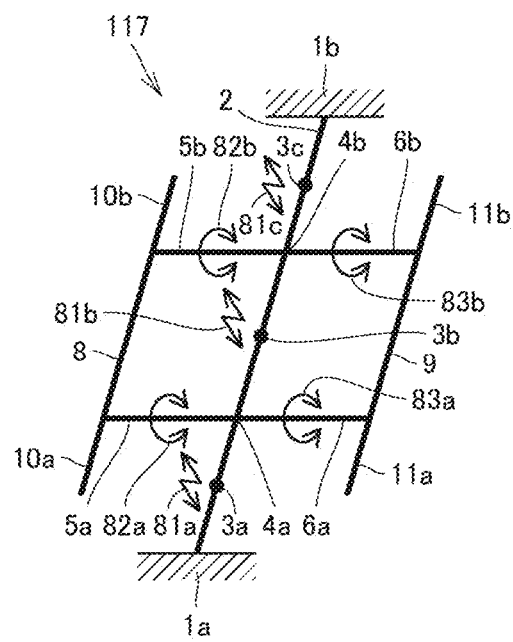
FIG. 43 is a conceptual view of a second example of the resonators of the eleventh embodiment according to the present invention.

As shown in FIG. 43, a resonator 117, which is a second example of the resonators of the present embodiment, includes a fourth beam 8 and a fifth beam 9, each of which has opposite ends projecting as free ends. The opposite ends of fourth beam 8 are projections 10a, 10b respectively. The ends of projections 10a, 10b are free ends. Thus, each of projections 10a, 10b is in a state of cantilever. The opposite ends of fifth beam 9 are projections 11a, 11b respectively. The ends of projections 11a, 11b are free ends. Thus, each of projections 11a, 11b is in a state of cantilever. Configurations of other portions are the same as those in resonator 115 illustrated in the tenth embodiment.

It should be noted that in FIG. 43, the respective lengths of projections 10a, 10b, 11a, 11b seem the same but may be different from one another. Further, the present invention is not limited to the configuration having projections at all the corners. A configuration having a corner with a projection and a corner with no projection is conceivable.

(Function and Effect)

In each of resonators 116, 117 of the present embodiment, at a plurality of vibration receiving locations 3a, 3b, 3c, first beam 2 is provided with linear reciprocating motions in the direction perpendicular to the longitudinal direction of first beam 2 as indicated by arrows 81a, 81b, 81c, thereby transversely vibrating first beam 2. On this occasion, the plurality of second beams 5a, 5b, each of which has its one end bound to first beam 2 via branching location 4a or 4b, are displaced following the transverse vibration of first beam 2, thereby generating torsional vibrations in the plurality of second beams 5a, 5b as indicated by arrows 82a, 82b respectively. Likewise, the plurality of third beams 6a, 6b are also bounded to first beam 2 via the plurality of branching locations 4a, 4b and are therefore displaced following the transverse vibration of first beam 2, thereby generating torsional vibrations in the plurality of third beams 6a, 6b as indicated by arrows 83a, 83b respectively. The tips of second beams 5a, 5b are coupled to each other via fourth beam 8, so torsional vibrations generated in second beams 5a, 5b affect each other by fourth beam 8. The same holds true for third beams 6a, 6b having their tips coupled to each other via fifth beam 9.

The torsional vibrations are utilized in the same way as described in the ninth embodiment.

In particular, resonators including the closed-loop structure such as resonators 116, 117 illustrated in the present embodiment can exhibit an effect of confinement of vibration energy. This leads to a high Q factor in such resonators.

Twelfth Embodiment

Configuration

Figure 44:
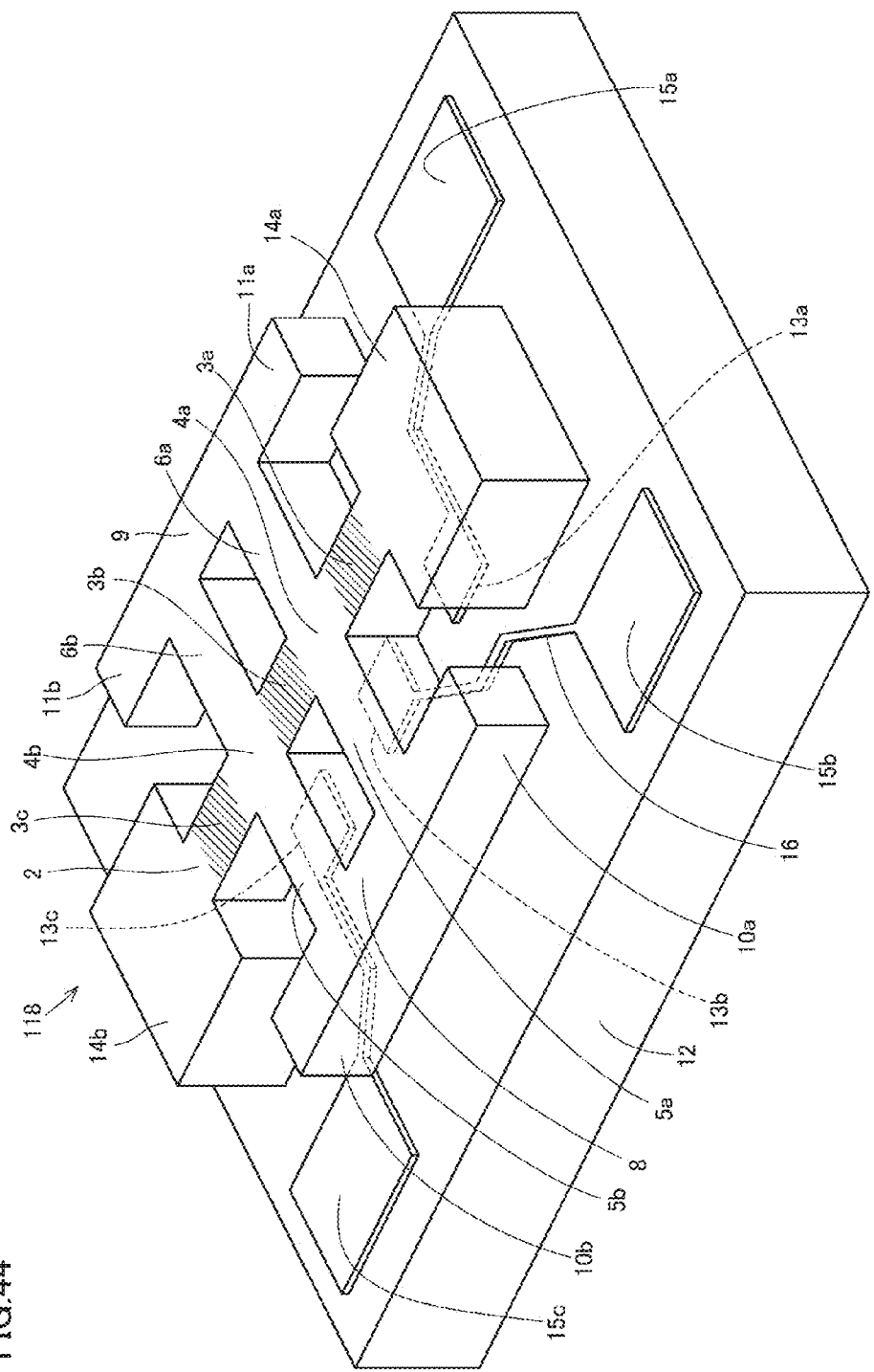
FIG. 44 is a conceptual view of a resonator of a twelfth embodiment according to the present invention.

Referring to FIG. 44, a resonator of a twelfth embodiment according to the present invention will be described. As shown in FIG. 44, a resonator 118 of the present embodiment is a structure corresponding to resonator 117 illustrated in the eleventh embodiment. Specifically, resonator 118 includes a substrate 12 serving as a base; a first beam 2 having opposite ends fixed to substrate 12, and having a plurality of vibration receiving locations 3a, 3b, 3c for providing linear reciprocating motions in a direction perpendicular to the longitudinal direction thereof; and a plurality of second beams 5a, 5b, branching toward one side from a plurality of branching locations 4a, 4b different from the plurality of vibration receiving locations 3a, 3b, 3c in first beam 2, for generating torsional vibrations in accordance with the linear reciprocating motions. In fixing the opposite ends of first beam 2 to substrate 12, they are not directly connected to the main body of substrate 12, but are connected thereto via fixed connection portions 14a, 14b formed on the upper surface of substrate 12. Fixed connection portions 14a, 14b may be formed of the same material as that of first beam 2. Fixed connection portions 14a, 14b work together with substrate 12 to serve as fixed ends for the opposite ends of first beam 2.

Resonator 118 includes a plurality of third beams 6a, 6b, extending from the plurality of branching locations 4a, 4b toward a side opposite to the plurality of second beam 5a, 5b, for generating torsional vibration. In resonator 118, the plurality of second beams 5a, 5b have their tips coupled to each other via a fourth beam 8, and the plurality of third beams 6a, 6b have their tips coupled to each other via a fifth beam 9. Each of fourth beam 8 and fifth beam 9 has opposite ends projecting as free ends. The opposite ends of fourth beam 8 are projections 10a, 10b respectively.

As indicated by a dashed line in FIG. 44, a plurality of electrodes 13a, 13b, 13c are provided on the upper surface of substrate 12 at locations corresponding to the plurality of vibration receiving locations 3a, 3b, 3c of first beam 2. From the plurality of electrodes 13a, 13b, 13c, wires 16 are drawn respectively. On the surface of substrate 12, a plurality of pads 15a, 15b, 15c are provided at locations where they are not covered with each of the beams when viewed from above. Wires 16 extend along the surface of substrate 12 to electrically connect the plurality of electrodes 13a, 13b, 13c and the plurality of pads 15a, 15b, 15c to one another respectively. The plurality of electrodes 13a, 13b, 13c are operative to generate electrostatic force between the plurality of electrodes 13a, 13b, 13c and the plurality of vibration receiving location 3a, 3b, 3c to provide first beam 2 with linear reciprocating motions. Each of the plurality of vibration receiving locations 3a, 3b, 3c may be an area with four sides each having a length of 10 μm, for example. Substrate 12 may be a glass substrate or a gallium arsenide (GaAs) substrate, for example. First beam 2 and the like are disposed with a space of for example 2 μm from the surface of substrate 12. The plurality of electrodes 13a, 13b, 13c are formed of gold, for example.

Specifically, in resonator 118 of the present embodiment, the base is substrate 12, and first beam 2 is distant away from substrate 12 but extending in parallel with the surface of substrate 12. In resonator 118 of the present embodiment, the surface of substrate 12 has locations respectively facing the plurality of vibration receiving locations 3a, 3b, 3c and individually provided with electrodes 13a, 13b, 13c. Electrodes 13a, 13b, 13c are operative to generate electrostatic force between electrodes 13a, 13b, 13c and vibration receiving locations 3a, 3b, 3c to provide first beam 2 with linear reciprocating motions.

Resonator 118 of the present embodiment includes an input control unit (not shown) for controlling potential differences between the electrodes and the vibration receiving locations so that the electrodes simultaneously provide linear reciprocating motions to the plurality of vibration receiving locations 3a, 3b, 3c. The input control unit may be operative to simultaneously provide linear reciprocating motions of the same phase to the vibration receiving locations adjacent to each other. The input control unit may be operative to simultaneously provide linear reciprocating motions of phases shifted by π from each other, to the vibration receiving locations. Whether the phases are the same or different or how much the phases are shifted may be appropriately determined depending on applications.

(Function and Effect)

In resonator 118 of the present embodiment, a certain voltage is applied between each of the plurality of pads 15a, 15b, 15c and first beam 2 to cause potential differences between the plurality of electrodes 13a, 13b, 13c and the plurality of vibration receiving locations 3a, 3b, 3c of first beam 2. The voltage thus applied between each of the plurality of pads 15 and first beam 2 may be for example 1-2 V. The potential difference between each of the plurality of electrodes 13a, 13b, 13c and each of the plurality of vibration receiving locations 3a, 3b, 3c causes generation of electrostatic force between each of the plurality of electrode 13a, 13b, 13c and each of the plurality of vibration receiving locations 3a, 3b, 3c. The electrostatic force provides linear reciprocating motions to the plurality of vibration receiving locations 3a, 3b, 3c of first beam 2. Accordingly, first beam 2 is transversely vibrated. On this occasion, torsional vibrations take place in the plurality of second beams 5a, 5b and the plurality of third beams 6a, 6b.

(Simulation)

The inventors have conducted simulation to find how each beam behaves when linear reciprocating motions are provided to resonator 112. An outline of the simulation will be described.

Figure 45:
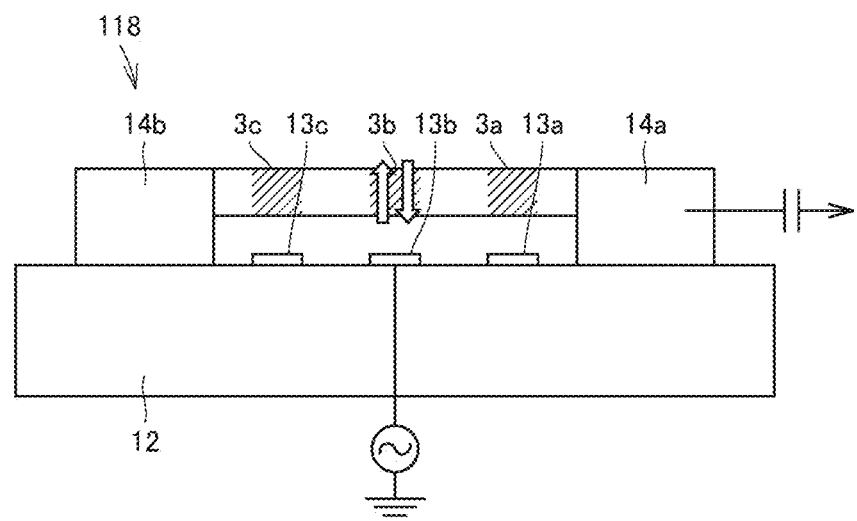
FIG. 45 is a schematic view of a first voltage application pattern in simulation conducted for the resonator of the twelfth embodiment according to the present invention.
Figure 46:
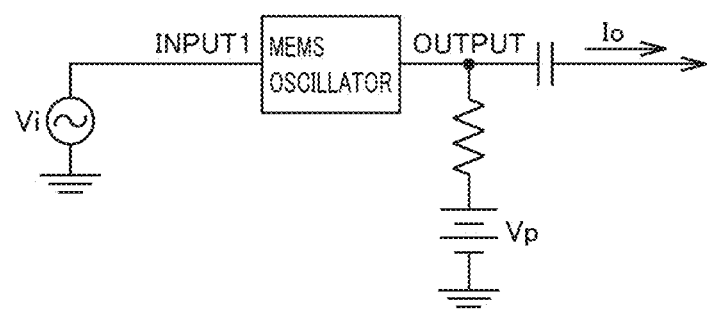
FIG. 46 is a circuit diagram corresponding to FIG. 45.

First, as a first voltage application pattern, simulation has been conducted with only central electrode 13b of resonator 118 being fed with a voltage, as shown in FIG. 45. Electrodes 13a, 13c are not fed with any voltage. In this case, linear reciprocating motion is provided thereto only at vibration receiving location 3b. FIG. 46 shows a corresponding circuit diagram.

Figure 47:
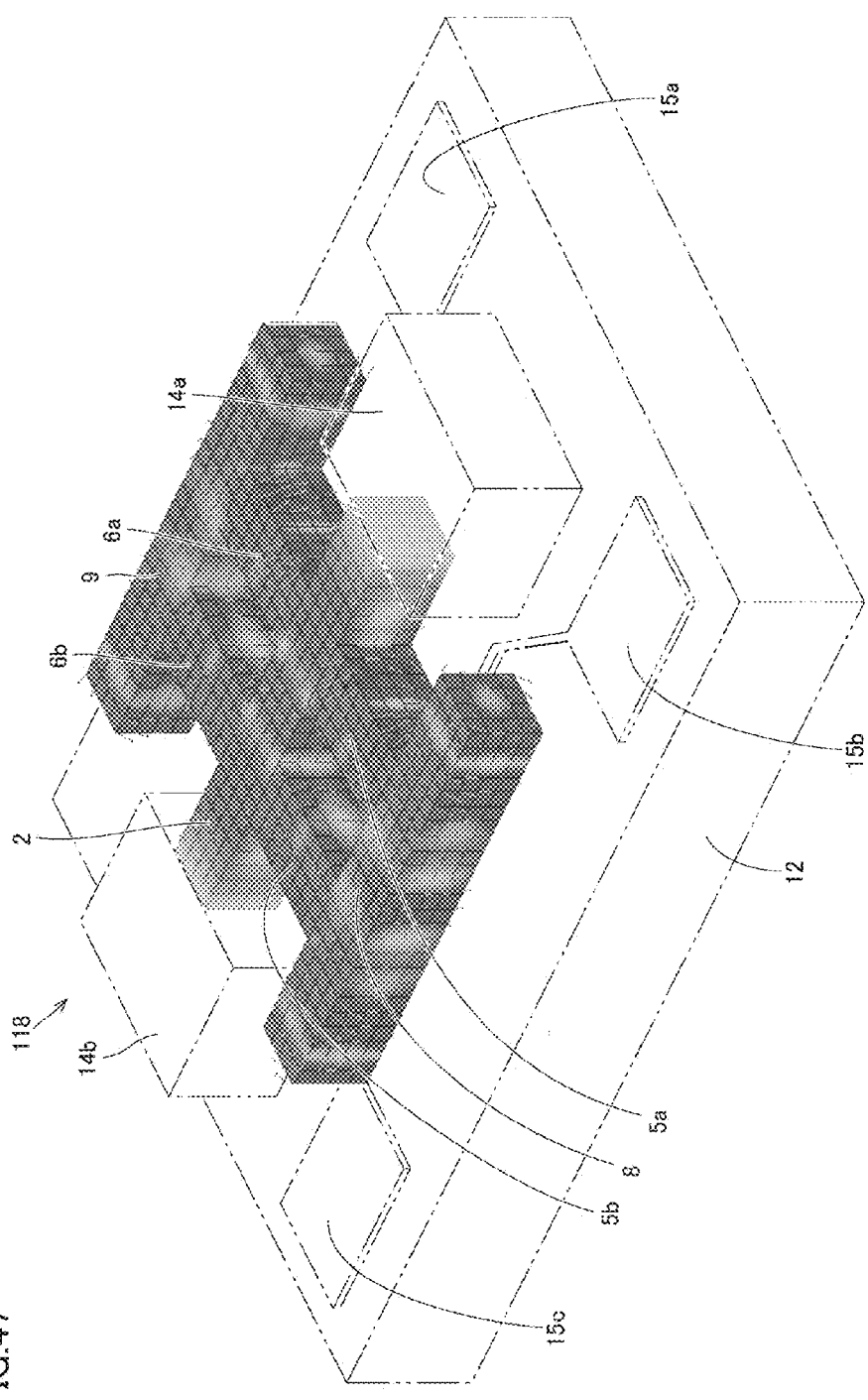
FIG. 47 is a first schematic view showing how the resonator of the twelfth embodiment according to the present invention is vibrated.
Figure 48:
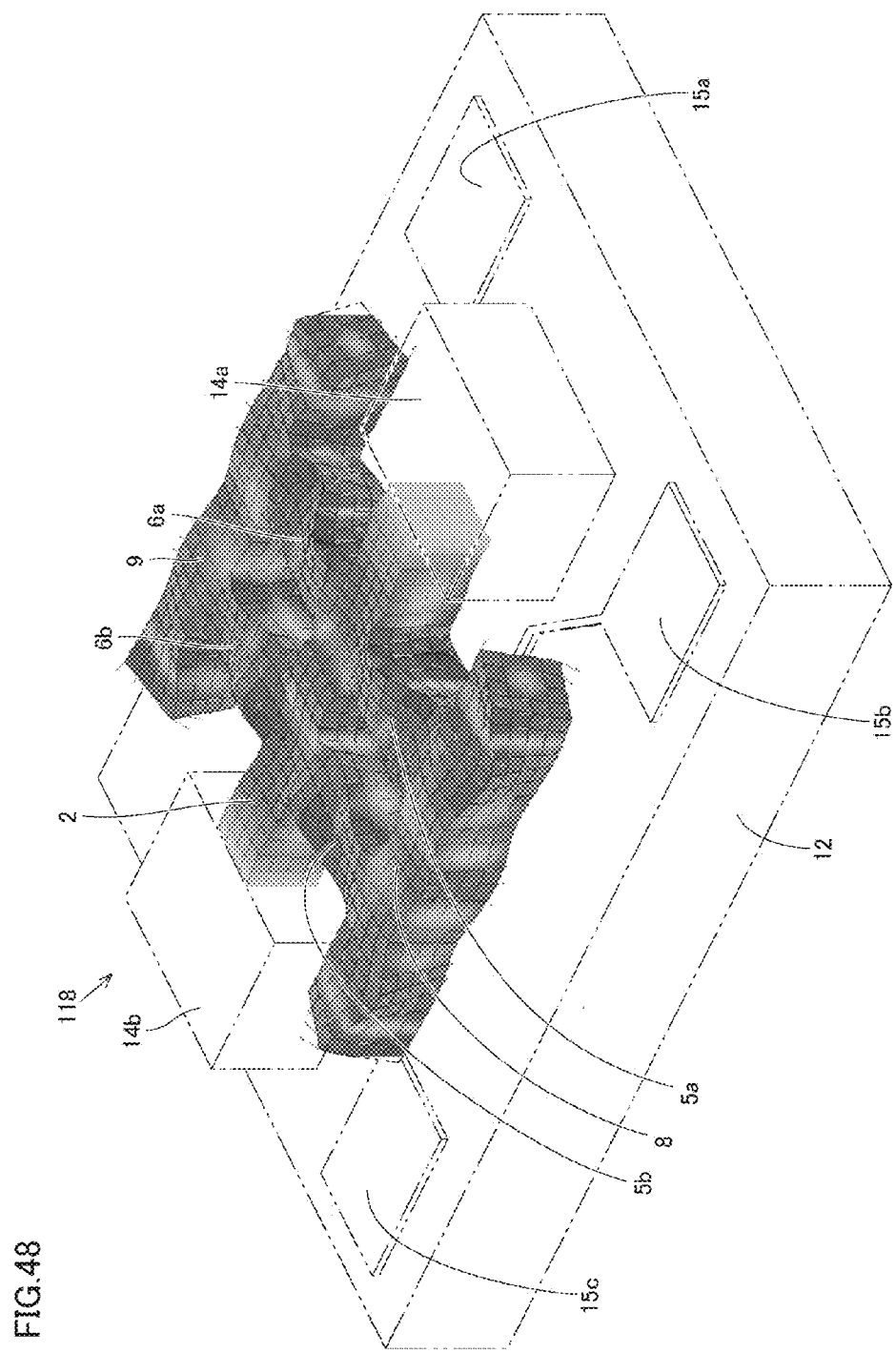
FIG. 48 is a second schematic view showing how the resonator of the twelfth embodiment according to the present invention is vibrated.
Figure 49:
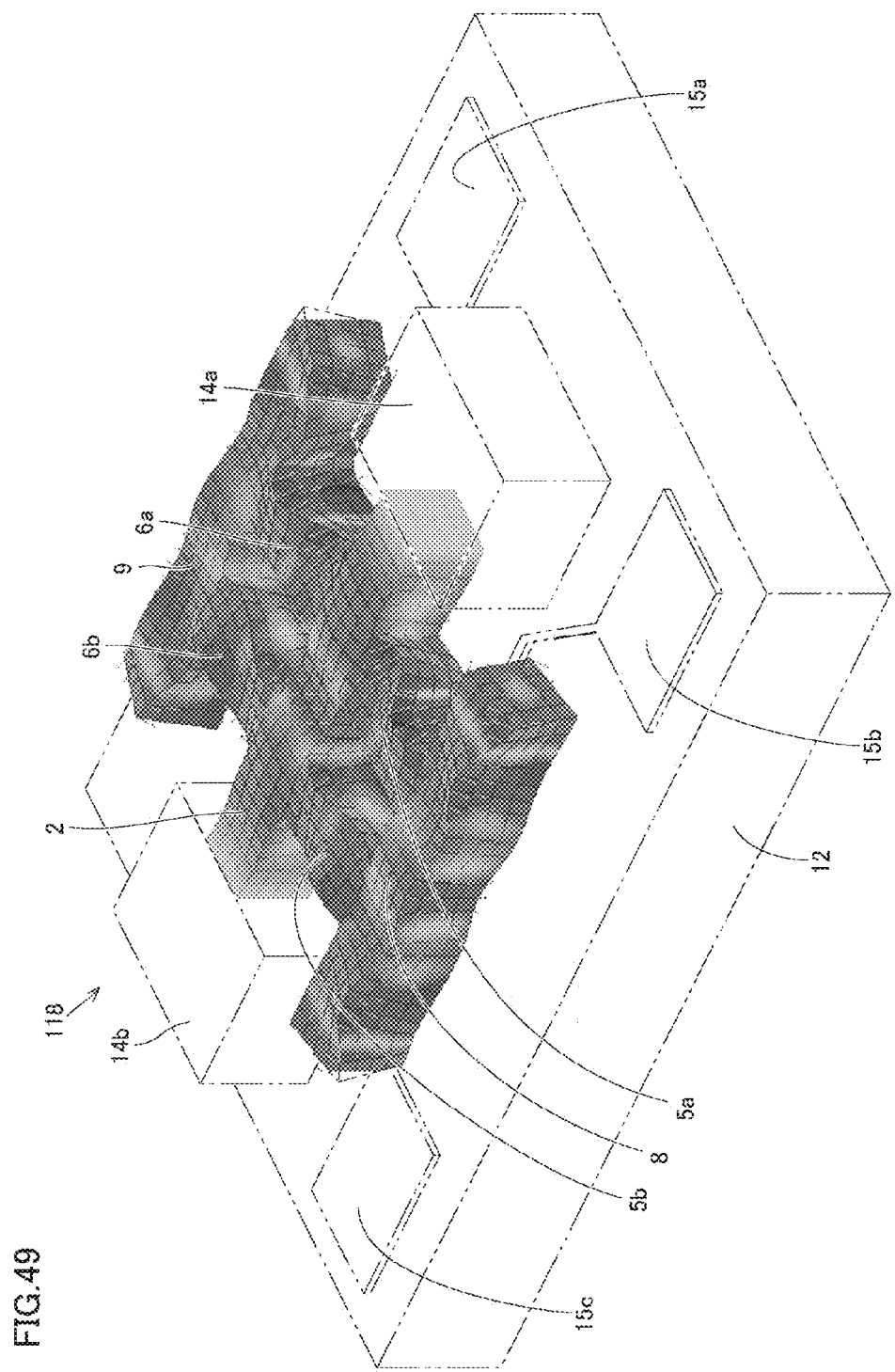
FIG. 49 is a third schematic view showing how the resonator of the twelfth embodiment according to the present invention is vibrated.

FIGS. 47-49 show how resonator 118 vibrates on this occasion. FIGS. 47-49 show deformation thereof based on a simulation result obtained by a computer. For ease of description, the degree of deformation of each of the beams in these figures is illustrated with exaggeration. The entire resonator 118 torsionally and transversely vibrates repeatedly by being brought into the following states sequentially:

. . . →FIG. 47→FIG. 48→FIG. 47→FIG. 49→FIG. 47→FIG. 48→FIG. 47→FIG. 49→FIG. 47→FIG. 48→FIG. 47→FIG. 49→FIG. 47→FIG. 48→FIG. 47→ . . . .

As shown in FIGS. 48 and 49, torsional vibrations take place in the plurality of second beams 5a, 5b and the plurality of third beams 6a, 6b.

It should be noted that a multiplicity of small arrows are illustrated in FIGS. 47-49 at the surface of each beam for convenience of the simulation.

As seen from FIGS. 48 and 49, when a degree of torsion in second beam 5a is compared with a degree of torsion of a second beam 5b and a degree of torsion in third beam 6a is compared with a degree of torsion in third beam 6b, they are substantially symmetrical to each other. For example, at the time of FIG. 48, respective portions close to fourth beam 8 in the upper surfaces of second beams 5a, 5b are moved to incline in directions in which they are getting away from each other, whereas respective portions close to first beam 2 in the upper surfaces of second beams 5a, 5b are moved to incline in directions in which they are approaching to each other. Such symmetrical torsions can be found in other portions. The same holds true at the time of FIG. 49.

Figure 50:
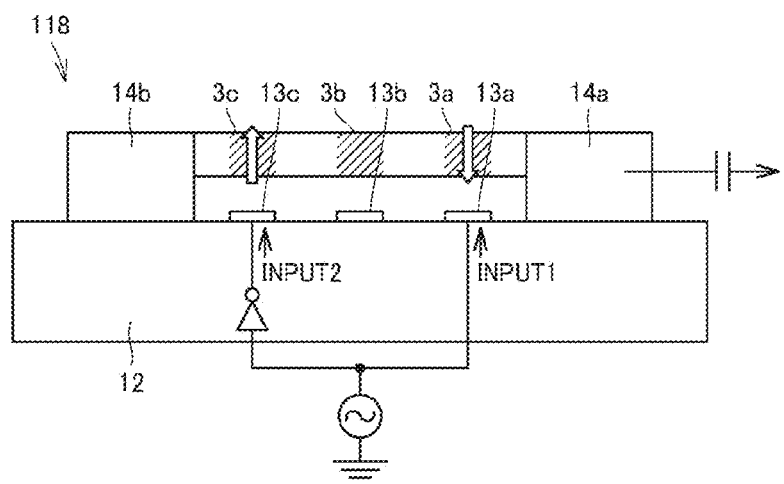
FIG. 50 is a schematic view of a second voltage application pattern in simulation conducted for the resonator of the twelfth embodiment according to the present invention.
Figure 51:
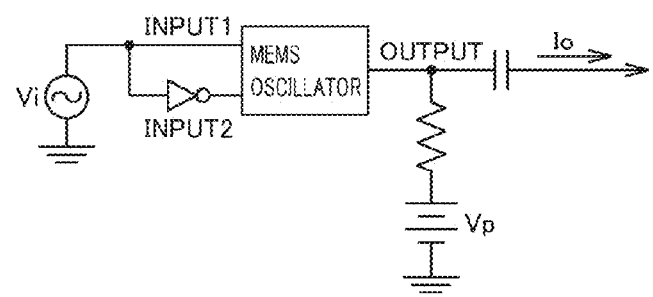
FIG. 51 is a circuit diagram corresponding to FIG. 50.

Next, simulation has been conducted as a second voltage application pattern, with only electrodes 13a, 13c of resonator 118 at the opposite ends being fed with voltages while applying no voltage to central electrode 13b as shown in FIG. 50. Electrodes 13a, 13c are fed with voltages of phases shifted by π from each other, rather than voltages of the same phase. In other words, INPUT1 and INPUT2 have phases shifted by π from each other. In this case, linear reciprocating motions are provided thereto only at vibration receiving locations 3a, 3c. FIG. 51 shows a corresponding circuit diagram.

Figure 52:
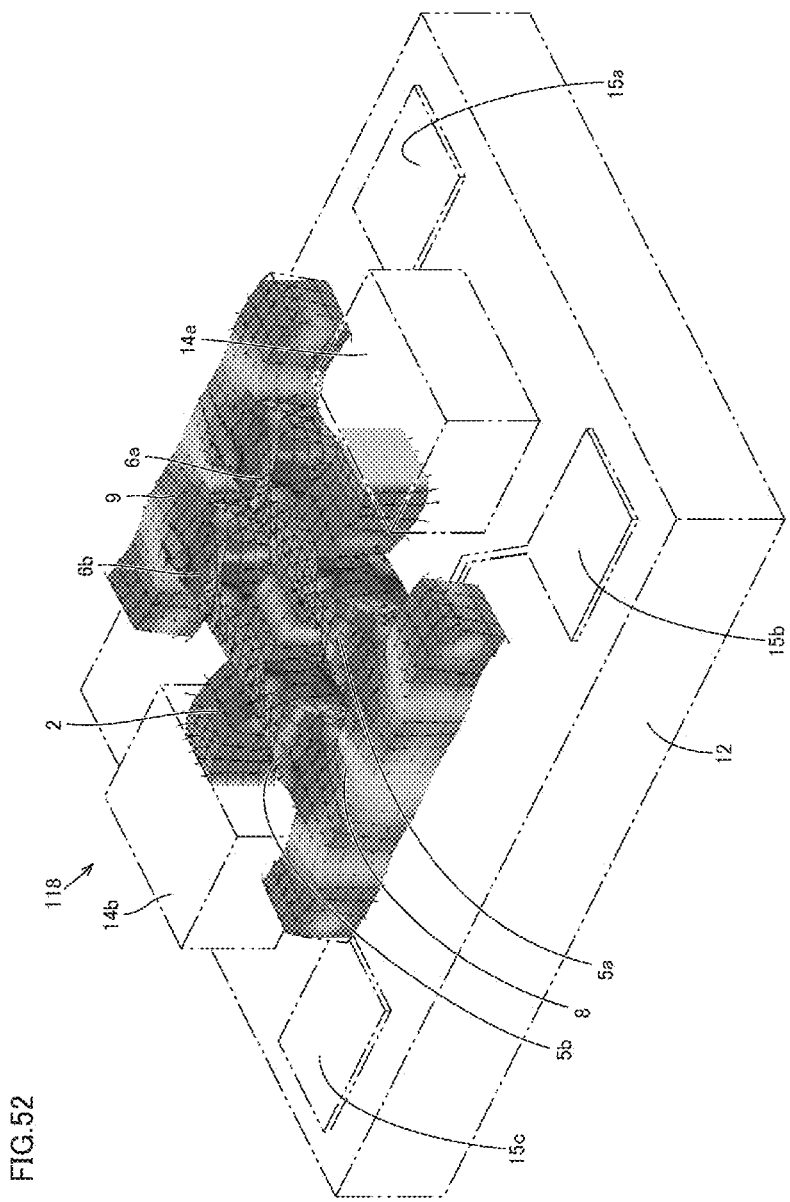
FIG. 52 is a fourth schematic view showing how the resonator of the twelfth embodiment according to the present invention is vibrated.
Figure 53:
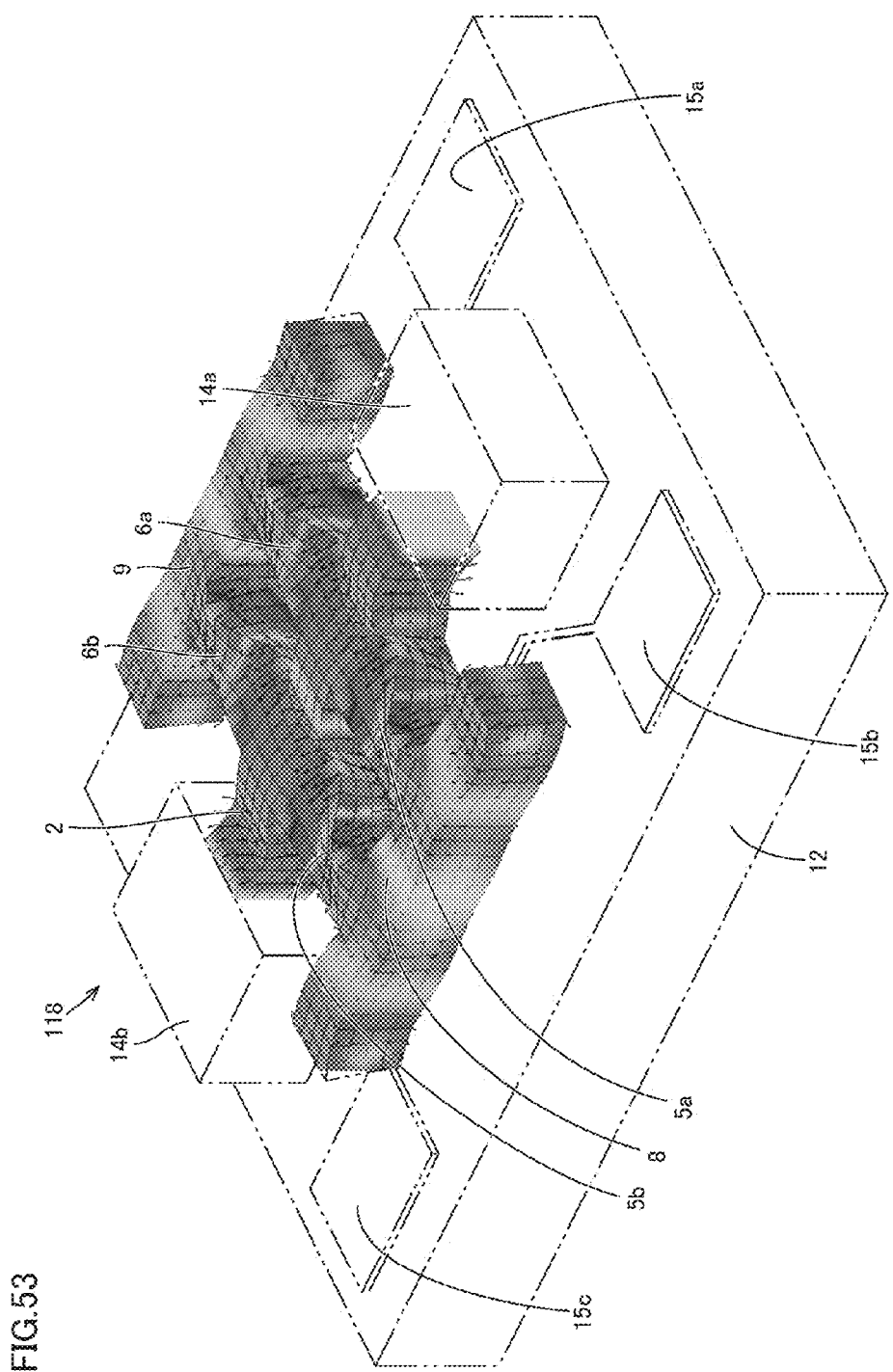
FIG. 53 is a fifth schematic view showing how the resonator of the twelfth embodiment according to the present invention is vibrated.

FIGS. 47, 52, 53 show how resonator 112 vibrates on this occasion. The entire resonator 118 torsionally and transversely vibrates repeatedly by being brought into the following states sequentially:

. . . →FIG. 47→FIG. 52→FIG. 47→FIG. 53→FIG. 47→FIG. 52→FIG. 47→FIG. 53→FIG. 47→FIG. 52→FIG. 47→FIG. 53→FIG. 47→FIG. 52→FIG. 47→ . . . .

As shown in FIGS. 52 and 53, torsional vibrations take place in the plurality of second beams 5a, 5b and the plurality of third beams 6a, 6b.

As seen from FIGS. 52 and 53, when a degree of torsion in second beam 5a is compared with a degree of torsion in second beam 5b and a degree of torsion in third beam 6a is compared with a degree of torsion in third beam 6b, they are twisted in the same direction. For example, at the time of FIG. 52, portions close to fourth beam 8 in second beams 5a, 5b are both moved to incline downward at its right side in the figure, whereas portions close to first beam 2 in the upper surfaces of second beams 5a, 5b are moved to incline upward at its right side therein. Such uniform torsions are found in other portions. The same holds true at the time of FIG. 53.

Figure 54:
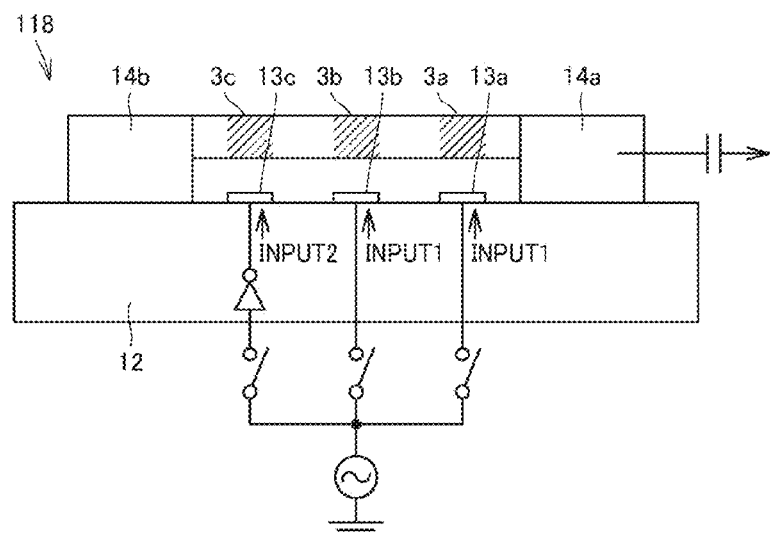
FIG. 54 is a schematic view of an example in which switches are provided in the resonator of the twelfth embodiment according to the present invention.

In order to switch between the first voltage application pattern and the second voltage application pattern, switches are provided at the wires connected to the electrodes respectively as shown in FIG. 54. These switches may be controlled by the above-described input control unit.

The simulation result presented herein is a mere example, and the mode of vibration can be appropriately changed by changing parameters such as the intensity of each signal provided to pads 15a, 15b, 15c, the frequency thereof, the length of each beam, the positioning of the branching locations, the number of beams branching therefrom, the angle of each of the branching beams, and the cross sectional shape of each beam.

Now, in torsional vibration, a portion repeatedly displaced in the torsion direction greatly is regarded as a "loop", and a portion not displaced in the torsion direction is regarded as a "node". The number of loops and nodes appearing in one beam can differ depending on the mode of vibration. In the example described herein, the number of the plurality of second beams 5a, 5b are two and the number of the plurality of third beams 6a, 6b are also two, but the number of each of them may be any number other than two.

An advantage of utilizing such generated torsional vibration as vibration of the resonator, and utilization thereof for the resonator are the same as described in the first embodiment. Vibration energy stored in the vibrating portions as a result of the torsional vibrations of the plurality of second beams 5a, 5b and the plurality of third beams 6a, 6b can be electrically extracted through electrodes 13a, 13b, 13c and pads 15a, 15b, 15c.

The configuration in which the opposite ends of first beam 2 are fixed to substrate 12 is presented herein, but a configuration in which only one end of first beam 2 is fixed to substrate 12 can be conceived as a variation.

(Manufacturing Method)

Referring to FIGS. 55-69, a method for manufacturing the resonator of the present embodiment will be described.

Figure 55:
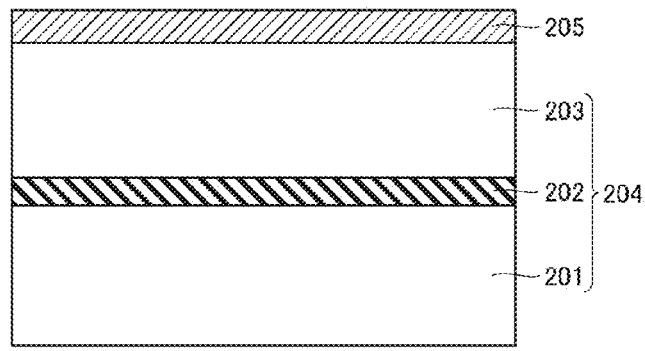
FIG. 55 is a schematic view of a first process of a method for manufacturing the resonator of the twelfth embodiment according to the present invention.

First, as shown in FIG. 55, chromium is deposited on the upper surface of an SOI wafer 204 to form a Cr film 205. In SOI wafer 204, a SiO$_2$ layer 202 is provided on a Si layer 201, and a Si layer 203 is formed on SiO$_2$ layer 202. Si layer 203 has a thickness of for example 10 μm. Cr film 205 is formed on the upper surface of Si layer 203. Cr layer 205 has a thickness of for example 500 Å.

Figure 56:
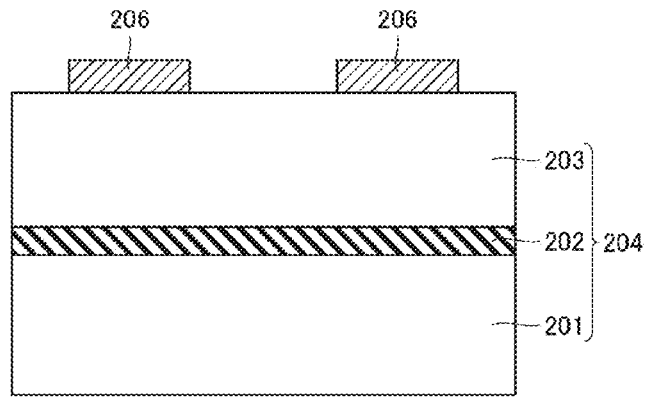
FIG. 56 is a schematic view of a second process of the method for manufacturing the resonator of the twelfth embodiment according to the present invention.
Figure 57:
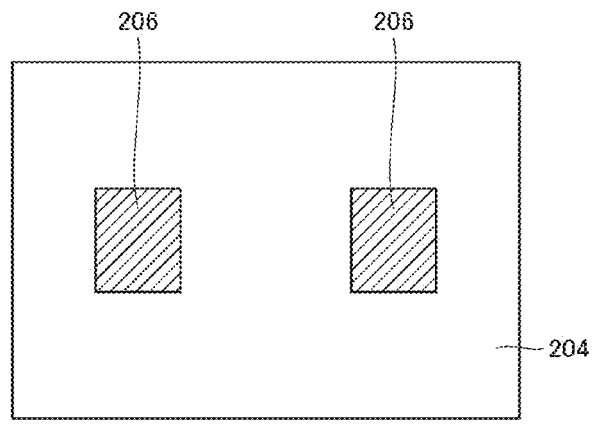
FIG. 57 is a plan view corresponding to FIG. 56.

As shown in FIG. 56, Cr film 205 is subjected to first photolithography to form Cr film patterns 206. FIG. 19 shows a plan view of this state. Cr film patterns 206 are formed in the form of islands at two locations, for example. Cr film patterns 206 correspond to areas in which fixed connection portions 14a, 14b will be formed.

Figure 58:
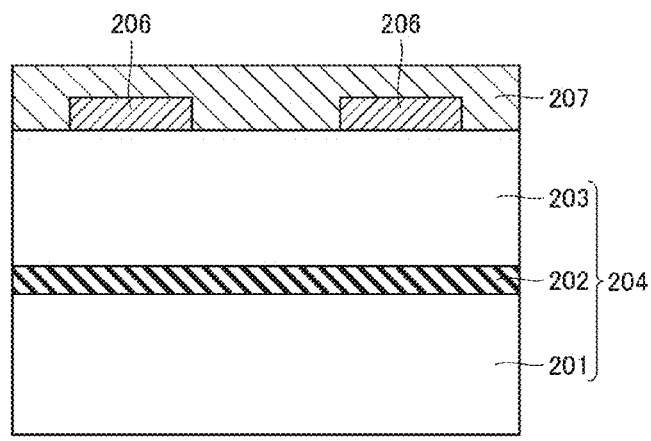
FIG. 58 is a schematic view of a third process of the method for manufacturing the resonator of the twelfth embodiment according to the present invention.

As shown in FIG. 58, aluminum is deposited on the upper surface of Si layer 203 to form an Al film 207 that completely covers Cr film pattern 206. Al film 207 has a thickness of for example 1000 Å.

Figure 59:
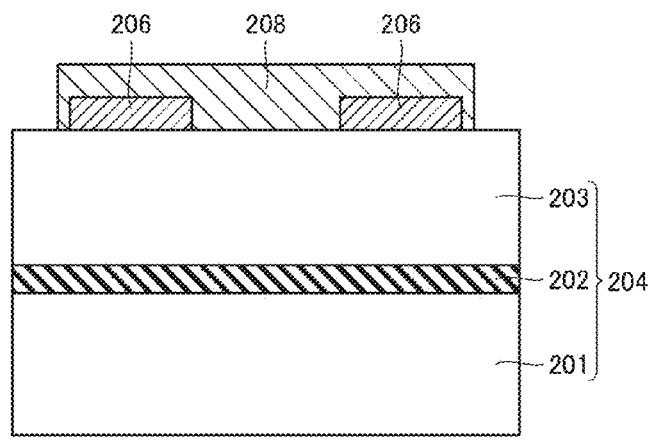
FIG. 59 is a schematic view of a fourth process of the method for manufacturing the resonator of the twelfth embodiment according to the present invention.
Figure 60:
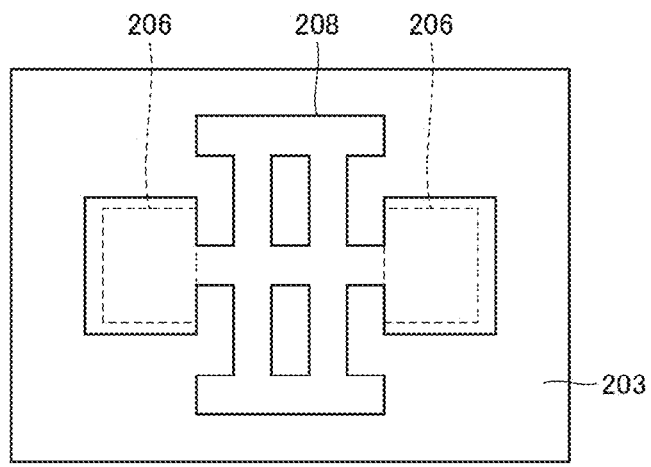
FIG. 60 is a plan view corresponding to FIG. 59.

As shown in FIG. 59, Al film 207 is subjected to second photolithography to form an Al film pattern 208, which is left according to a certain pattern. FIG. 60 shows a plan view of this state. Al film pattern 208 has a planar shape including portions corresponding to the beams of the resonator.

Figure 61:
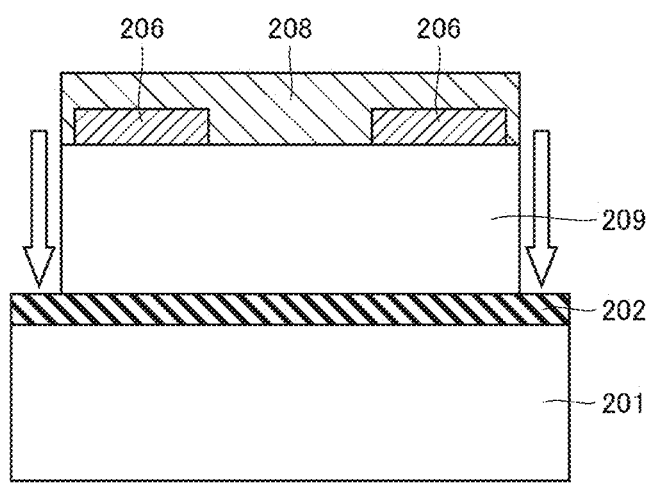
FIG. 61 is a schematic view of a fifth process of the method for manufacturing the resonator of the twelfth embodiment according to the present invention.
Figure 62:
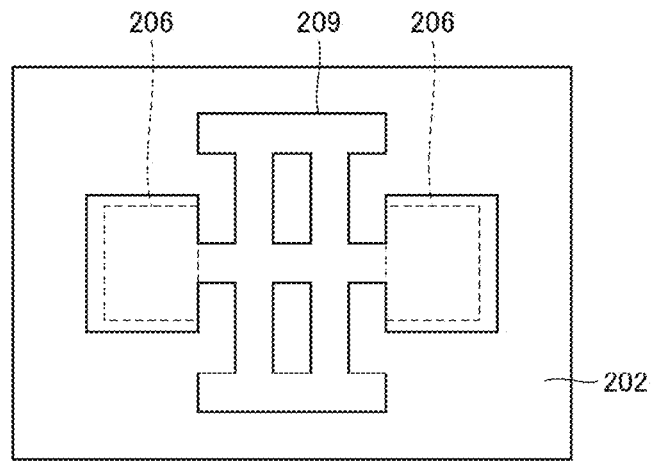
FIG. 62 is a plan view corresponding to FIG. 61.

Then, using Al film pattern 208 as a mask, Si layer 203 (see FIG. 60) is subjected to dry etching. As shown in FIG. 61, areas not covered with Al film pattern 208 in Si layer 203 are removed to expose SiO$_2$ layer 202. In this example, since Si layer 203 has a thickness of 10 μm, the dry etching is performed up to a depth of approximately 10 μm. By this dry etching, a Si layer pattern 209 is formed. FIG. 62 shows a plan view of this state. Si layer pattern 209 has a planar shape including portions corresponding to the beams of the resonator. On this occasion, Cr film patterns 206 are not exposed because they are within Al film pattern 208.

Figure 63:
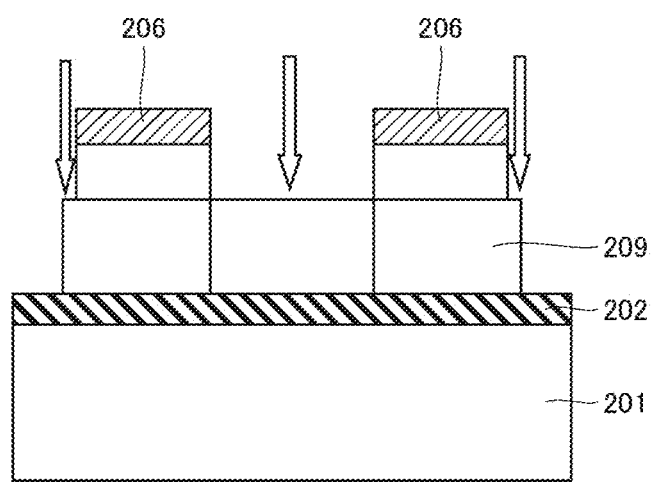
FIG. 63 is a schematic view of a sixth process of the method for manufacturing the resonator of the twelfth embodiment according to the present invention.
Figure 65:
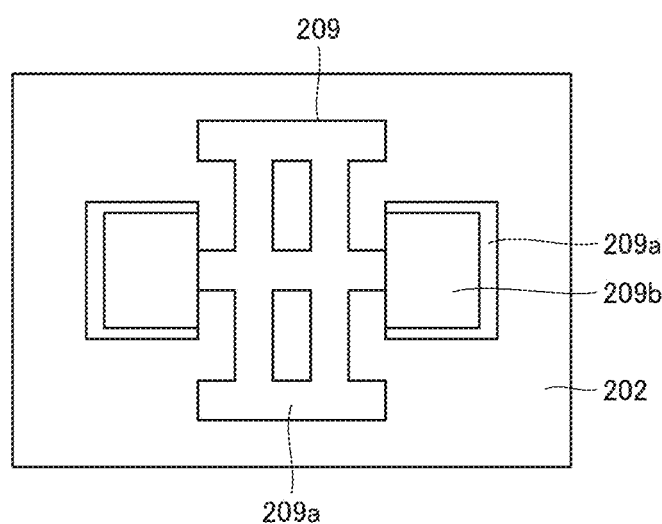
FIG. 65 is a plan view corresponding to FIG. 64.

Then, Al film pattern 208 (see FIG. 61) is removed, and Si layer pattern 209 is subjected to dry etching using Cr film patterns 206 as masks as shown in FIG. 63. The dry etching thus performed is ICP (Inductively Coupled Plasma) etching. By the dry etching, areas not covered with Cr film patterns 206 in Si layer pattern 209 are etched away by for example 4 μm from the upper surface thereof. Then, Cr film patterns 206 are removed, thereby obtaining a structure shown in FIG. 26. FIG. 65 shows a plan view of this state. On this occasion, in this structure, Si layer pattern 209 is on SiO$_2$ layer 202 and includes low portions 209a and high portions 209b. High portions 209b are portions that used to be covered with Cr film patterns 206.

Figure 66:
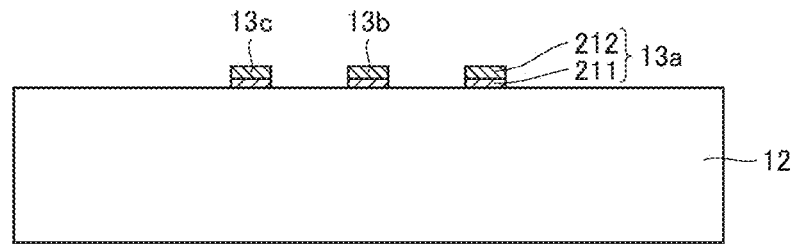
FIG. 66 is a schematic view of an eighth process of the method for manufacturing the resonator of the twelfth embodiment according to the present invention.
Figure 67:
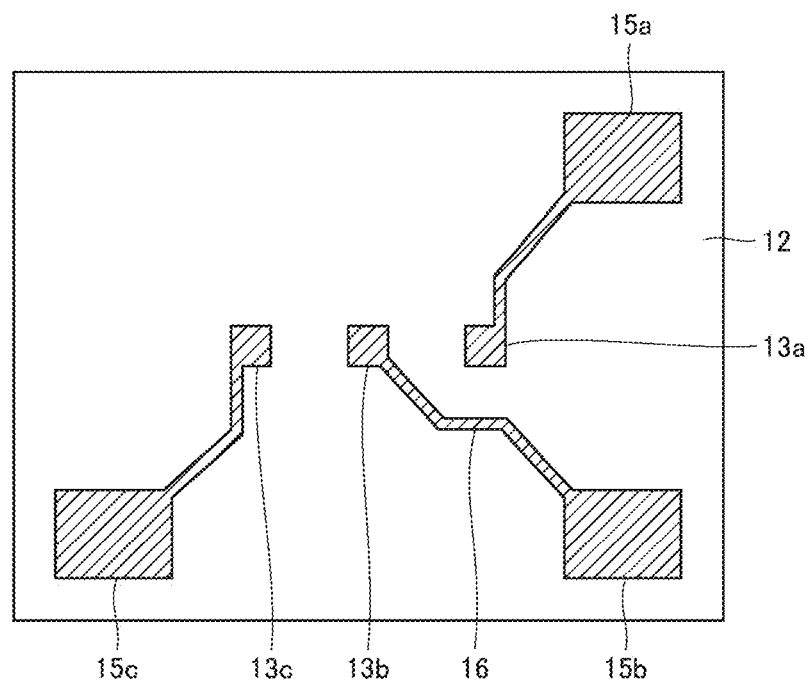
FIG. 67 is a plan view corresponding to FIG. 66.

Meanwhile, a chromium film is formed as a seed layer on the upper surface of substrate 12, which is a separately prepared glass substrate. Then, a gold layer is formed to entirely cover the chromium layer. These metal layers are patterned to form stacked-layer patterns in each of which Au layer 212 is on the upper side of Cr layer 211 as shown in FIG. 66. FIG. 67 shows a plan view of this state. At the center of substrate 12, the plurality of electrodes 13a, 13b, 13c are disposed in a line to provide linear reciprocating motions to the beams by means of electrostatic force. Adjacent to ends of substrate 12, pads 15a, 15b, 15c are disposed. Electrodes 13a, 13b, 13c and pads 15a, 15b, 15c are electrically connected to one another via wires 16, correspondingly. Each of the electrodes, each of the pads, and each of the wires are formed in one piece, and each of them is constituted by the two-layer structure of Au/Cr.

Figure 64:
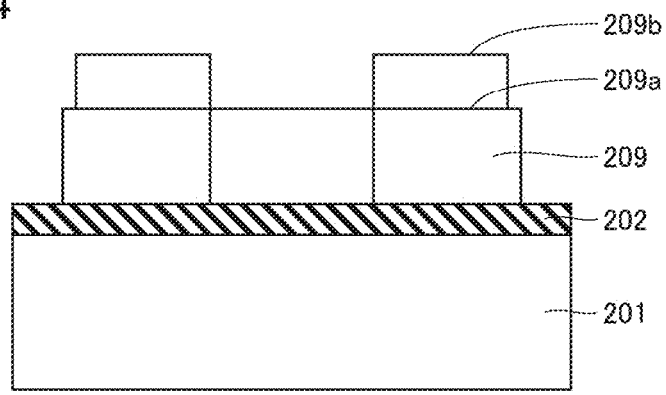
FIG. 64 is a schematic view of a seventh process of the method for manufacturing the resonator of the twelfth embodiment according to the present invention.
Figure 68:
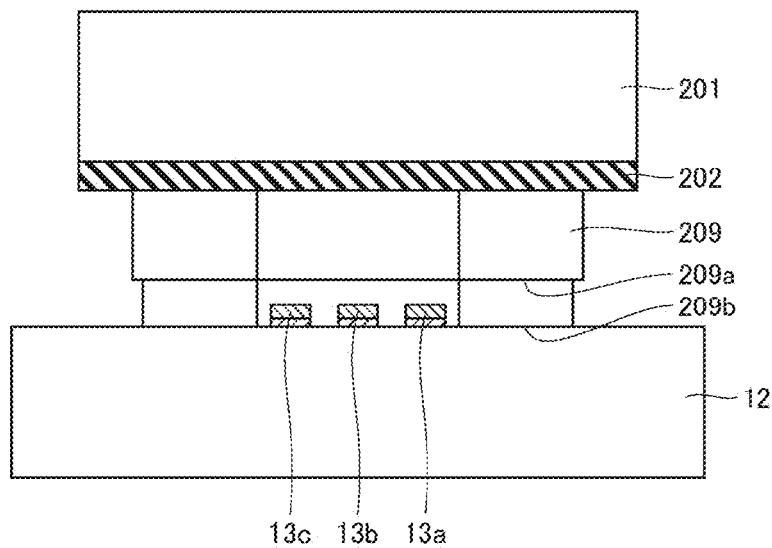
FIG. 68 is a schematic view of a ninth process of the method for manufacturing the resonator of the twelfth embodiment according to the present invention.

Then, the structure shown in FIG. 64 is turned upside down, and is bonded to the structure shown in FIG. 66. The bonding is achieved by anode bonding. As a result, a structure shown in FIG. 68 is obtained. High portions 209b of Si layer pattern 209 are bonded to the surface of the substrate 12, and low portions 209a are distant away from the surface of substrate 12. Thereafter, Si layer 201 is removed by etching.

Figure 69:
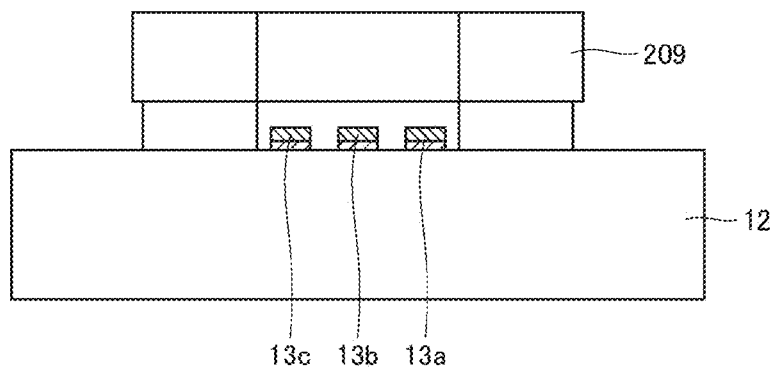
FIG. 69 is a schematic view of a tenth process of the method for manufacturing the resonator of the twelfth embodiment according to the present invention.

Then, SiO$_2$ layer 202 is removed by etching. As a result, a structure shown in FIG. 69 is obtained. Namely, resonator 118 shown in FIG. 44 is obtained.

In each of the above-described embodiments, the number of vibration receiving locations is three but may be any number other than three.

Thirteenth Embodiment (Resonator Array)

Figure 70:
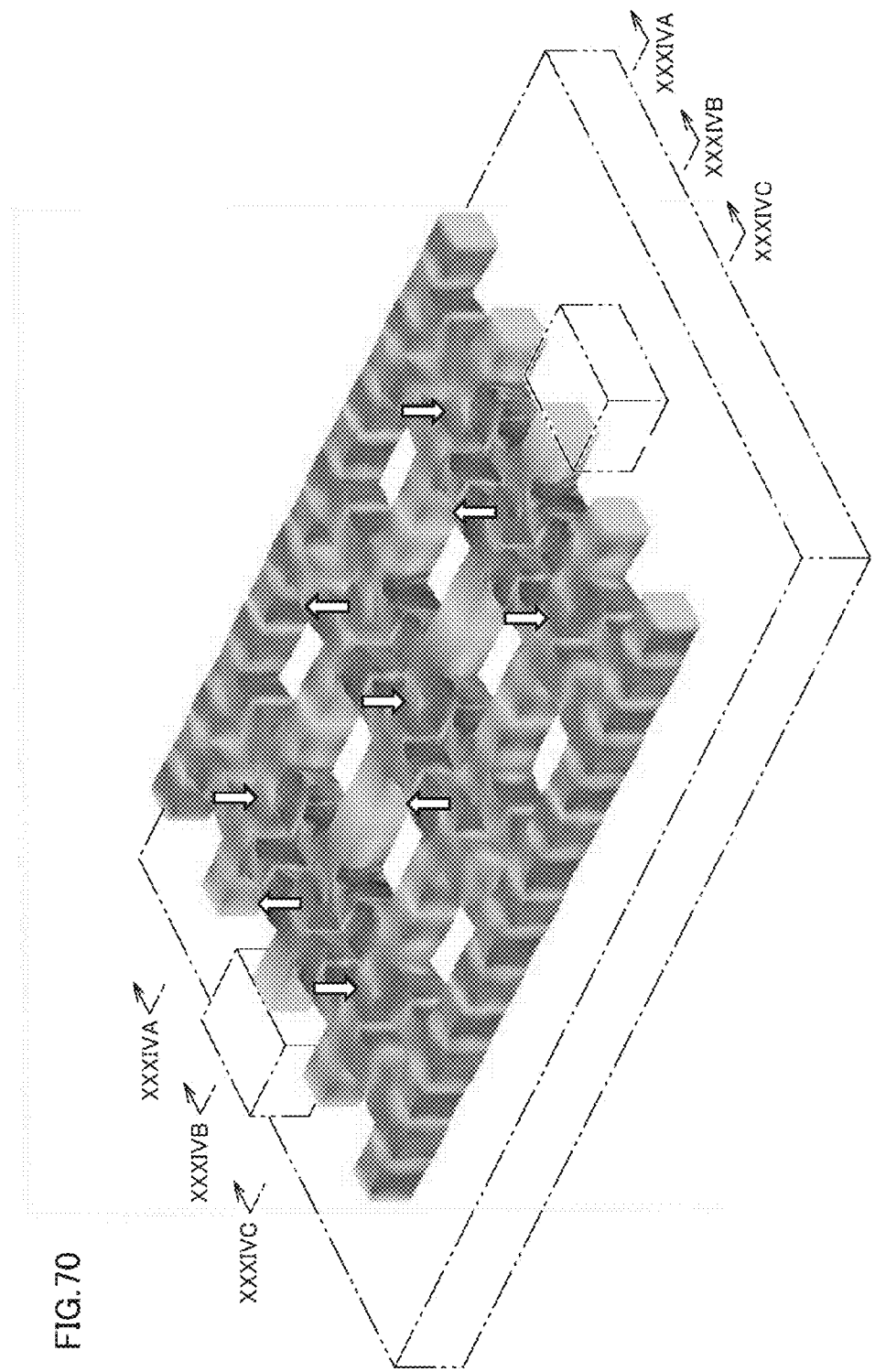
FIG. 70 is a perspective view of a resonator array of a thirteenth embodiment according to the present invention.
Figure 71:
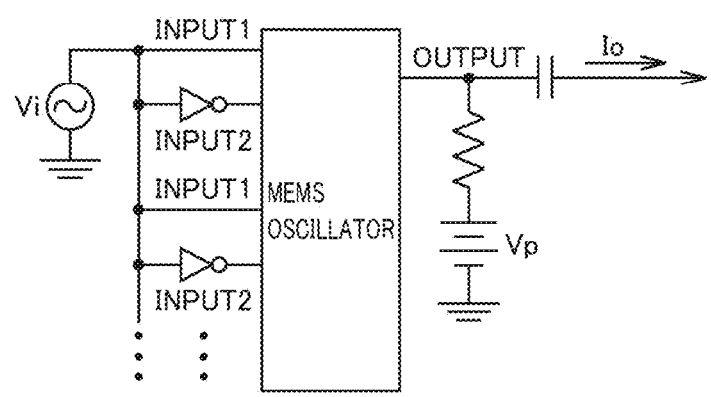
FIG. 71 is a circuit diagram corresponding to FIG. 70.
Figure 72:
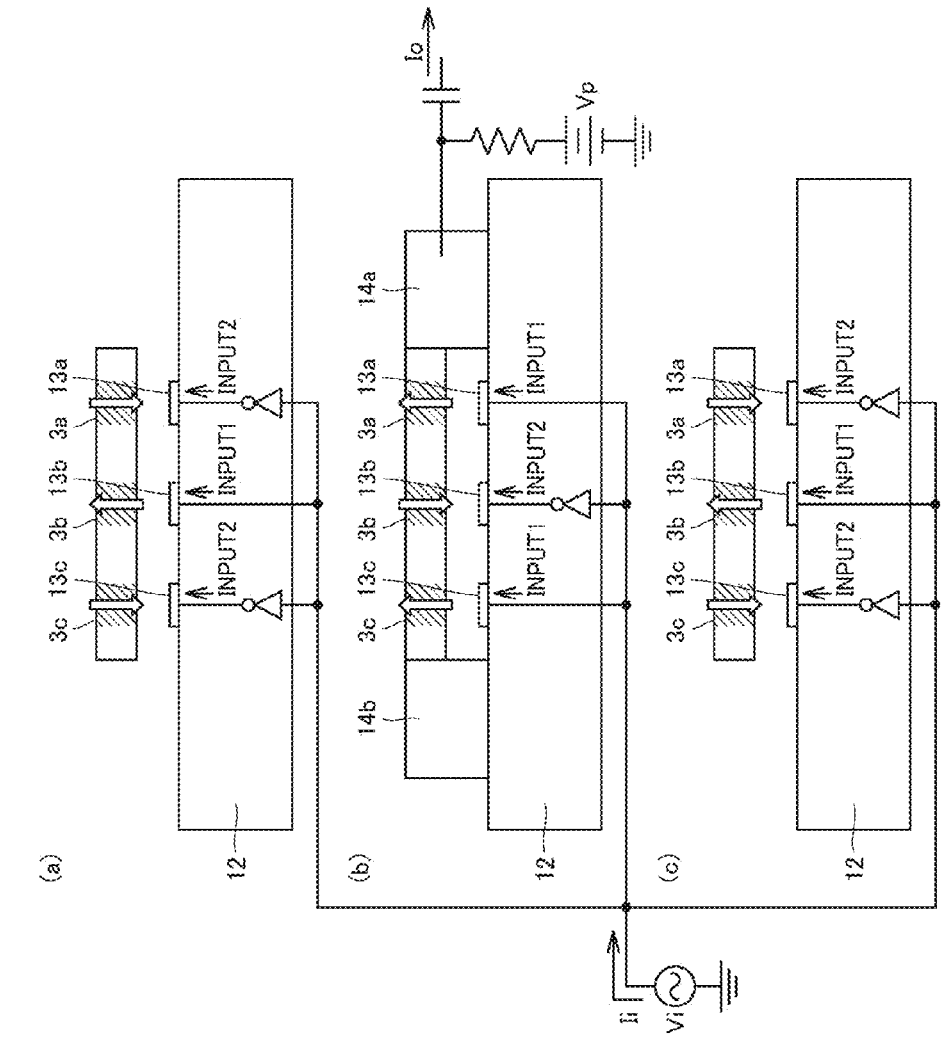
FIG. 72(a)-FIG. 72(c) are cross sectional views respectively taken along a line XXXIVA-XXXIVA, a line XXXIVB-XXXIVB, and a line XXXIVC-XXXIVC in FIG. 70.

Referring to FIG. 70, a resonator array according to an thirteenth embodiment of the present invention will be described. The resonator array of the present embodiment is formed as follows. In the resonator described in any of the above-described embodiments, the locations to be fixed to the base(s) and the locations to be the free ends are replaced with connection portions for adjacent resonators, and a plurality of such resonators are connected to one another. Namely, the resonator array is such as the one shown in FIG. 70. In the description herein, there are five projections in the front side thereof and there are also five projections in the back side. A projection at the center in each of the front side and the back side is to serve as a fixed end. The number of the fixed ends and the locations of the fixed ends may differ. A structure may be employed which includes some substrate, by which the resonator array is supported, as shown as a double dashed line in FIG. 70. In this case, the resonator array has portions other than the connection portions for supporting and disposed distant away from and in parallel with the surface of the substrate. Further, the resonator array may be supported by some means without using such a substrate. FIG. 71 shows a corresponding circuit diagram. FIG. 72(a) conceptually shows a cross sectional view thereof taken along a line XXXIVA-XXXIVA in FIG. 70. Similarly, FIG. 72(b) conceptually shows a cross sectional view thereof taken along a line XXXIVB-XXXIVB, and FIG. 72(c) conceptually shows a cross sectional view taken along a line XXXIVC-XXXIVC. In the resonator array, among electrodes arranged in the form of matrix on the surface of the substrate when viewed in plan, electrodes each fed with an INPUT1 and electrodes each fed with an INPUT2 having a phase shifted by π from that of INPUT1 are arranged alternately when viewed in column and row.

In the description herein, the exemplary resonator array is illustrated which has 3×3, i.e., nine vibration receiving locations, but the number of vibration receiving locations may be any other number. The number of resonators arranged in column and the number of resonators arranged in row in the resonator array are both three in FIG. 70, but may be any number other than three. Further, the size of the resonator array may be larger or smaller than that shown in FIG. 70. For example, the resonator array may be configured so that several ten or hundred resonators are connected to one another therein.

(Explanation for Circuit)

The following describes operations of each of the resonators or the resonator arrays, from viewpoint of an electrical circuit.

(Operation of Resonator)

Figure 36:
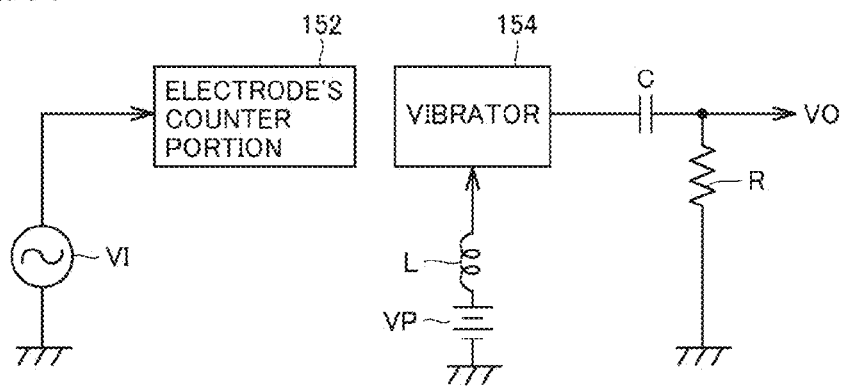
FIG. 36 illustrates operations of an MEMS resonator according to the present invention.

FIG. 36 illustrates operations of each MEMS resonator according to the present invention. An alternating-current voltage V1 is applied from a high frequency power source to a counter electrode 152. A principal voltage VP is applied from a principal voltage power source to a torsional vibrator 154 via a coil L. This causes generation of alternating electrostatic force between torsional vibrator 154 and counter electrode 152. The electrostatic force thus generated causes torsional vibrator 154 to torsionally vibrate around the central axis of the beam. The torsional vibration of torsional vibrator 154 results in change in capacitance between torsional vibrator 154 and counter electrode 152. Via capacitor C, the change in capacitance is output as a high frequency signal VO from the other end of resistor R having one end connected to a ground.

It should be noted that the term "torsional vibrator" herein corresponds to the beam of the resonator described in each of the first to thirteenth embodiments. In the case where the beam branches or is constituted by a combination of a plurality of beams, the entire combination of such beams corresponds to the "torsional vibrator". The substrate is not included in the torsional vibrator.

(Filter Circuit)

Figure 37:
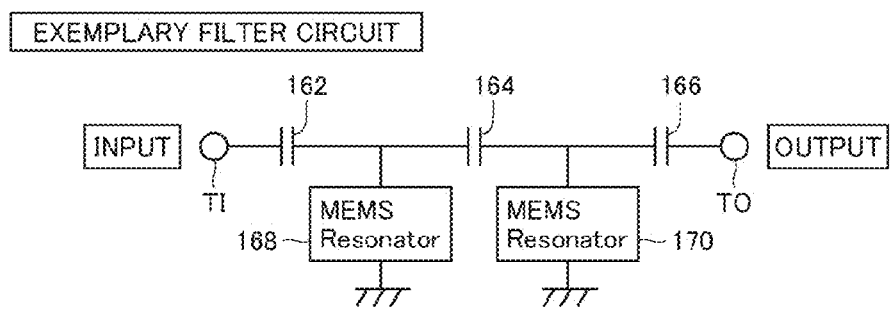
FIG. 37 is a circuit diagram showing an example of utilizing the MEMS resonator for a filter circuit.

FIG. 37 shows an example of using MEMS resonators for a filter circuit. The filter circuit shown in this circuit diagram includes capacitors 162, 164, 166 connected in series between an input terminal TI and an output terminal TO; an MEMS resonator 168 connected between a connection node of capacitors 162, 164 and a ground node; and an MEMS resonator 170 connected between a connection node of capacitors 164, 166 and a ground node. For each of MEMS resonators 168, 170 in such a filter circuit, the resonators according to the present invention can be used.

(Oscillating Circuit)

Figure 38:
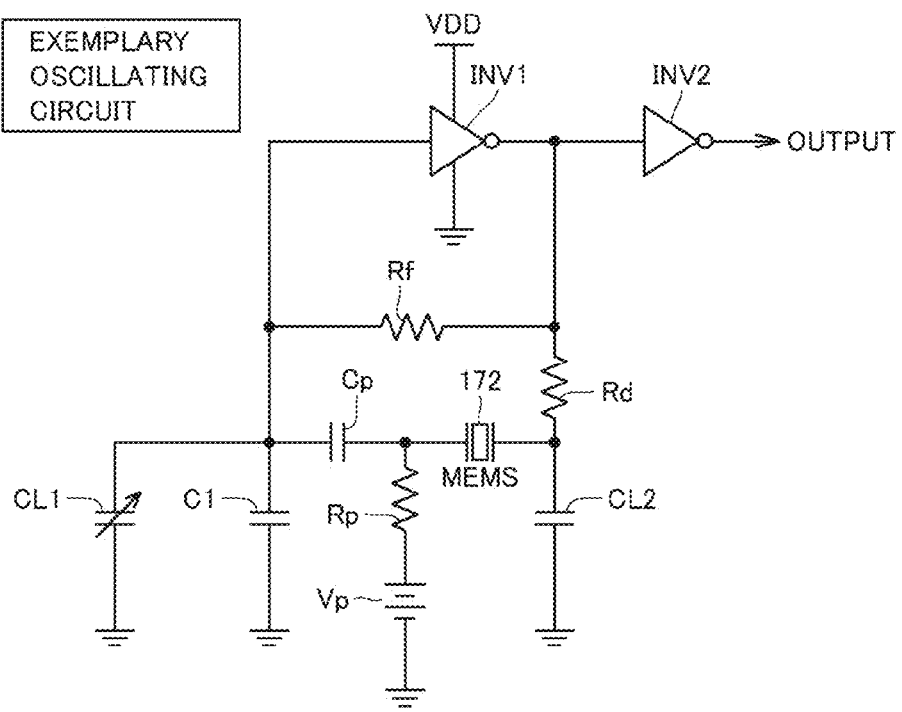
FIG. 38 is a circuit diagram showing an example of utilizing the MEMS resonator for an oscillating circuit.

FIG. 38 shows an example of using an MEMS resonator for an oscillating circuit. The oscillating circuit shown in this circuit diagram includes an inverter INV1 receiving a power source potential supplied from a power source node VDD; and an inverter INV2 having an input that receives an output of inverter INV1. Inverter INV2 outputs an output signal of this oscillating circuit. The oscillating circuit further includes a capacitor C1 having one end grounded and the other end connected to the input of inverter INV1; a variable capacitance capacitor CL1 connected to capacitor C1 in parallel; a direct current voltage source Vp having a grounded negative electrode; a resistor Rp having one end connected to a positive electrode of direct current voltage source Vp; a capacitor Cp connected between the other end of resistor Rp and the input of inverter INV1; a resistor Rd and a capacitor CL2 connected in series between the output of inverter INV1 and the ground; and an MEMS resonator 172 connected between a connection node of resistor Rd and capacitor CL2 and the other end of resistor Rp. This oscillating circuit further includes a feedback resistor Rf that connects the input and output of inverter INV1 to each other. In this oscillating circuit, the output of inverter INV1 is fed back to the input thereof by a filter including MEMS resonator 172, and a component of a specific resonance frequency is amplified. As a result, the circuit oscillates.

For MEMS resonator 172 in such an oscillating circuit, the resonators according to the present invention can be used.

It should be noted that in each of the above-described embodiments, each of the beams has a square cross sectional shape, but the cross sectional shape may be any shape other than square. Further, the first beam and the other beams may have cross sectional shapes different in size. When the first beam is thicker than the other beams, vibrations of the bending mode can be suppressed in the first beam.

Although the embodiments of the present invention have been described, it should be considered that the embodiments disclosed herein are illustrative and non-restrictive in any respect. The scope of the present invention is defined by the scope of claims, and is intended to include any modifications within the scope and meaning equivalent to the terms of the claims.

DESCRIPTION OF THE REFERENCE SIGNS

1: base; 2: first beam; 3, 3a, 3b, 3c: vibration receiving location; 4: first branching location; 4a, 4b: branching location; 5, 5a, 5b: second beam; 6, 6a, 6b: third beam; 7: second branching location; 8: fourth beam; 9: fifth beam; 10a, 10b, 11a, 11b: projection; 12: substrate; 13, 13a, 13b, 13c: electrode; 14a, 14b: fixed connection portion; 15, 15a, 15b, 15c: pad; 16: wire; 81, 81a, 81b, 81c: arrow (indicative of provided linear reciprocating vibration); 82, 82a, 82b, 83a, 83b: arrow (indicative of generated torsional vibration); 101, 102, 103, 104, 105, 106, 107, 108, 109, 110, 111, 112, 113, 114, 115, 116, 117, 118: resonator; 152: counter electrode; 154: torsional vibrator; 162, 164, 166: capacitor; 168, 170, 172: MEMS resonator; 201: Si layer; 202: SiO$_2$ layer; 203: Si layer; 204: SOI wafer; 205: Cr film; 206: Cr film pattern; 207: Al film; 208: Al film pattern; 209: Si layer pattern; 210: glass substrate; 211: Cr layer; 212: Au layer.

The invention claimed is:

1. A resonator comprising:
a base;
a first beam having one end fixed to said base and having a vibration receiving location for providing linear reciprocating motion in a direction perpendicular to a longitudinal direction thereof; and
a second beam, branching toward one side from a first branching location different from said vibration receiving location in said first beam and having a tip that is not fixed to said base, for generating torsional vibration that is utilized as vibration of the resonator, in accordance with said linear reciprocating motion.

2. The resonator according to claim 1, wherein said first beam has the other end fixed to said base.

3. The resonator according to claim 1 or 2, comprising:
a third beam, extending from said first branching location toward a side opposite to said second beam, for generating torsional vibration that is utilized as vibration of the resonator.

4. The resonator according to claim 1 or 2, comprising:
a third beam, extending toward a side opposite to said second beam from a second branching location different from said vibration receiving location and said first branching location in said first beam, for generating torsional vibration that is utilized as vibration of the resonator.

5. The resonator according to claim 1, wherein said base is a substrate and said first beam is distant away from said substrate and extending in parallel with a surface of said substrate.

6. The resonator according to claim 5, wherein the surface of said substrate has a location facing said vibration receiving location and is provided with an electrode for generating electrostatic force between said electrode and said vibration receiving location so as to provide the linear reciprocating motion to said first beam.

7. A resonator array, comprising:
a plurality of resonators according to claim 1 configured to be connected to one another to form the resonator array.

8. A resonator comprising:
a base;
a first beam having one end fixed to said base and having a vibration receiving location for providing linear reciprocating motion in a direction perpendicular to a longitudinal direction thereof; and
a plurality of second beams, branching toward one side from a plurality of first branching locations different from said vibration receiving location in said first beam and having tips that are not fixed to said base, for generating torsional vibration that is utilized as vibration of the resonator, in accordance with said linear reciprocating motion.

9. The resonator according to claim 8, wherein said first beam has the other end fixed to said base.

10. The resonator according to claim 8 or 9, comprising:
a plurality of third beams, extending from said plurality of first branching locations toward a side opposite to said plurality of second beams, for generating torsional vibration that is utilized as vibration of the resonator.

11. The resonator according to claim 10, wherein the tips of said plurality of second beams are coupled to each other via a fourth beam, and said plurality of third beams have tips coupled to each other via a fifth beam.

12. The resonator according to claim 11, wherein each of said fourth beam and said fifth beam has opposite ends projecting as free ends.

13. A resonator comprising:
a base;
a first beam having one end fixed to said base and having a plurality of vibration receiving locations for providing linear reciprocating motions in a direction perpendicular to a longitudinal direction thereof; and
a plurality of second beams, branching toward one side from a plurality of first branching locations different from said vibration receiving locations in said first beam and having tips that are not fixed to said base, for generating torsional vibrations that are utilized as vibrations of the resonator, in accordance with said linear reciprocating motions.

14. The resonator according to claim 13, wherein said first beam has the other end fixed to said base.

15. The resonator according to claim 13 or 14, comprising:
a plurality of third beams, extending from said plurality of first branching locations toward a side opposite to said plurality of second beams, for generating torsional vibrations that are utilized as vibrations of the resonator.

16. The resonator according to claim 15, wherein the tips of said plurality of second beams are coupled to each other via a fourth beam, and said plurality of third beams have tips coupled to each other via a fifth beam.

17. The resonator according to claim 16, wherein each of said fourth beam and said fifth beam has opposite ends projecting as free ends.

18. The resonator according to claim 13, wherein said base is a substrate, and said first beam is distant away from said substrate and extending in parallel with a surface of said substrate.

19. The resonator according to claim 18, wherein the surface of said substrate has locations respectively facing said plurality of vibration receiving locations and individually provided with electrodes for generating electrostatic force between each of said electrodes and each of said vibration receiving locations to provide the linear reciprocating motions to said first beam.

20. The resonator according to claim 19, comprising:
an input control unit for controlling a potential difference between each of said electrodes and each of said vibration receiving locations such that said electrodes simultaneously provide the linear reciprocating motions to said plurality of vibration receiving locations.

21. The resonator according to claim 20, wherein said input control unit is provided to simultaneously provide adjacent vibration receiving locations with the linear reciprocating motions of the same phase.

22. The resonator according to claim 20, wherein said input control unit is provided to simultaneously provide adjacent vibration receiving locations with linear reciprocating motions of phases shifted by $\pi$ from each other.

23. A resonator array, comprising:
a plurality of resonators according to claim 13 configured to be connected to one another to form the resonator array.

* * * * *